(12) United States Patent
Matsumoto et al.

(10) Patent No.: US 10,642,171 B2
(45) Date of Patent: May 5, 2020

(54) IMPRINT APPARATUS, IMPRINT METHOD, AND METHOD FOR PRODUCING ARTICLE

(71) Applicant: CANON KABUSHIKI KAISHA, Tokyo (JP)

(72) Inventors: Takahiro Matsumoto, Utsunomiya (JP); Kenichi Kobayashi, Utsunomiya (JP); Takafumi Miyaharu, Utsunomiya (JP); Yosuke Murakami, Utsunomiya (JP); Tatsuya Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 810 days.

(21) Appl. No.: 15/173,339

(22) Filed: Jun. 3, 2016

(65) Prior Publication Data

US 2016/0363874 A1   Dec. 15, 2016

(30) Foreign Application Priority Data

Jun. 10, 2015 (JP) .................................. 2015-117798
Feb. 5, 2016 (JP) .................................. 2016-020933

(51) Int. Cl.
*G03F 9/00* (2006.01)
*G03F 7/00* (2006.01)
*H01L 21/68* (2006.01)
*B29C 59/02* (2006.01)

(52) U.S. Cl.
CPC .......... *G03F 9/7042* (2013.01); *G03F 7/0002* (2013.01); *H01L 21/68* (2013.01); *B29C 2059/023* (2013.01)

(58) Field of Classification Search
None
See application file for complete search history.

(56) References Cited

U.S. PATENT DOCUMENTS

2013/0093113 A1*  4/2013  Hayashi ................ G03F 7/0002
                                                           264/40.1
2014/0339734 A1*  11/2014  Murakami ............ G03F 7/0002
                                                           264/293

FOREIGN PATENT DOCUMENTS

| JP | 2012-060074 A | 3/2012 |
| JP | 2013089663 A | 5/2013 |
| JP | 2013102137 A | 5/2013 |
| JP | 2014241396 A | 12/2014 |

(Continued)

*Primary Examiner* — Benjamin A Schiffman
(74) *Attorney, Agent, or Firm* — Canon U.S.A., Inc. IP Division

(57) ABSTRACT

An imprint apparatus includes a substrate holding unit. A generation unit generates heating distribution data indicating distribution of a heat value to be applied to a region to be processed. A heating unit gives heat to the region to be processed to deform the region. An obtaining unit which obtains first information defined based on a difference of shapes of the region and a pattern portion of the mold, and second information about a deformation amount of the region. The second information is obtained, by trying deformation of the region to be processed by the heating unit while the substrate holding unit attracts the substrate. A patterning unit forms the pattern while the heating unit is deforming the region to be processed based on the heating distribution data generated, in which the generation unit generates the heating distribution data based on the obtained first and second information.

17 Claims, 16 Drawing Sheets

(56) References Cited

FOREIGN PATENT DOCUMENTS

| | | |
|---|---|---|
| JP | 2015008279 A | 1/2015 |
| JP | 2015029070 A | 2/2015 |
| JP | 2015056589 A | 3/2015 |

* cited by examiner

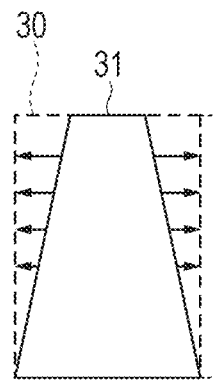 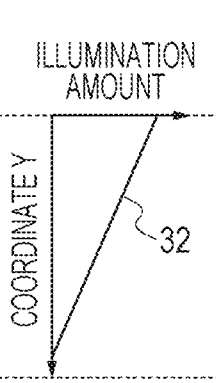 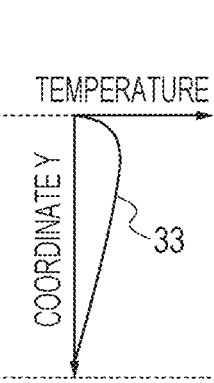 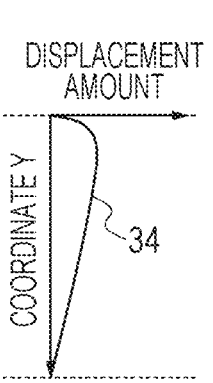
FIG. 4A  FIG. 4B  FIG. 4C  FIG. 4D
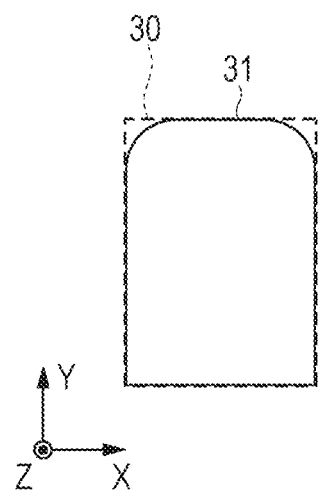
FIG. 4E

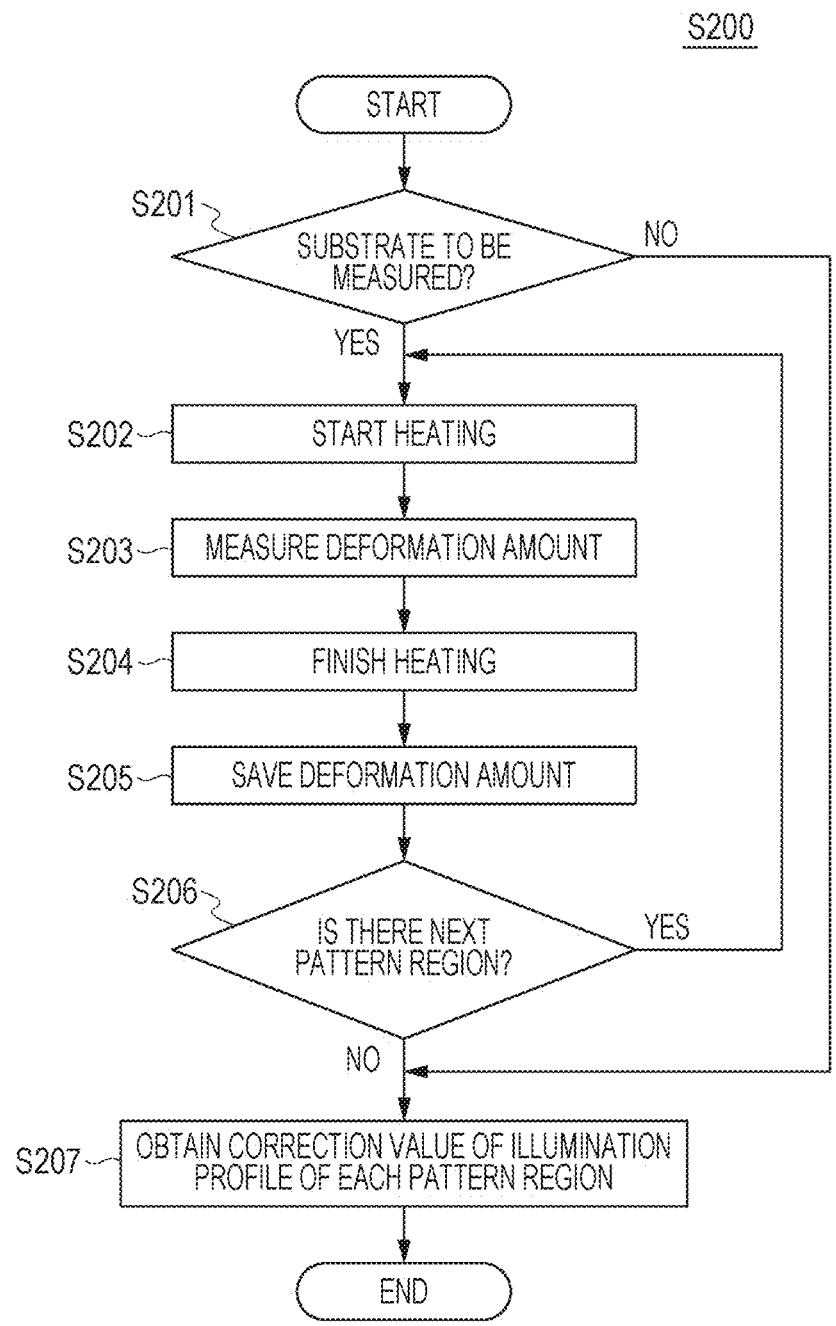

Sn(S1 TO S8): STANDARD ILLUMINATION PROFILE OF EACH PATTERN REGION
αn(α1 TO α8): CORRECTION COEFFICIENT OF EACH PATTERN REGION

An(A1 TO A4): STANDARD ILLUMINATION PROFILE OF EACH DIVIDED REGION
αn(α1 TO α4): CORRECTION COEFFICIENT

IMPRINT APPARATUS, IMPRINT METHOD, AND METHOD FOR PRODUCING ARTICLE

BACKGROUND OF THE INVENTION

Field of the Invention

The present invention relates to an imprint apparatus, an imprint method, and a method for producing an article.

Description of the Related Art

An imprint apparatus is known as an apparatus for forming a fine pattern on a substrate in order to produce a semiconductor device or the like. The imprint apparatus is an apparatus for making an imprint material supplied to the substrate and a mold contact with each other and giving energy for curing to the imprint material to thereby form a pattern of a cured composition onto which a concave-convex pattern of the mold is transferred.

For realizing high overlay precision in an imprint method, it is necessary to reduce a shape difference between a shape of a pattern portion and a shape of a region on the substrate, in which the pattern is to be formed. Japanese Patent Laid-Open. No. 2013-102137 discloses a method for illuminating a substrate with light for heating to thermally deform a local region and correcting a shape of a region in which a pattern is to be formed. By considering that the substrate becomes difficult to be thermally deformed due to a static frictional force acting between a substrate holding surface and the substrate when a holding mechanism holds the substrate by suction, a technique in which a control unit corrects an illumination amount of light based on a suction pressure of the holding mechanism is disclosed.

However, there is a case where a contact state between the substrate and the substrate holding surface varies according to a position on the substrate because of distortion of the substrate and the substrate holding surface in an out-of-plane direction (vertical direction). In this case, thermal deformability may have distribution (nonuniformity) even among regions held by suction with the same suction pressure.

SUMMARY OF THE INVENTION

The invention according to one embodiment of the invention provides an imprint apparatus and an imprint method which allow improvement of overlay precision.

The invention according to one aspect of the invention provides an imprint apparatus which forms a pattern in a region to be processed on a substrate by using a mold and an imprint material, including: a substrate holding unit which attracts and holds the substrate; a generation unit which generates heating distribution data indicating distribution of a heat value to be applied to the region to be processed; a heating unit which gives heat to the region to be processed to deform the region to be processed; an obtaining unit which obtains first information defined based on a difference of shapes of the region to be processed and a pattern portion of the mold, and second information about a deformation amount of the region to be processed, the second information being obtained by trying deformation of the region to be processed by the heating unit while the substrate holding unit is attracting the substrate; and a patterning unit configured to form the pattern while the heating unit is deforming the region to be processed based on the heating distribution data generated by the generation unit, in which the generation unit generates the heating distribution data based on the first information and the second information which are obtained by the obtaining unit.

Further features of the present invention will become apparent from the following description of exemplary embodiments with reference to the attached drawings.

BRIEF DESCRIPTION OF THE DRAWINGS

FIGS. 4A to 4E are diagrams for explaining shape correction by the heating mechanism.

FIG. 7 is a flowchart for explaining a method for selecting a measurement region.

DESCRIPTION OF THE EMBODIMENTS

First Exemplary Embodiment

Apparatus Configuration

Figure 1:
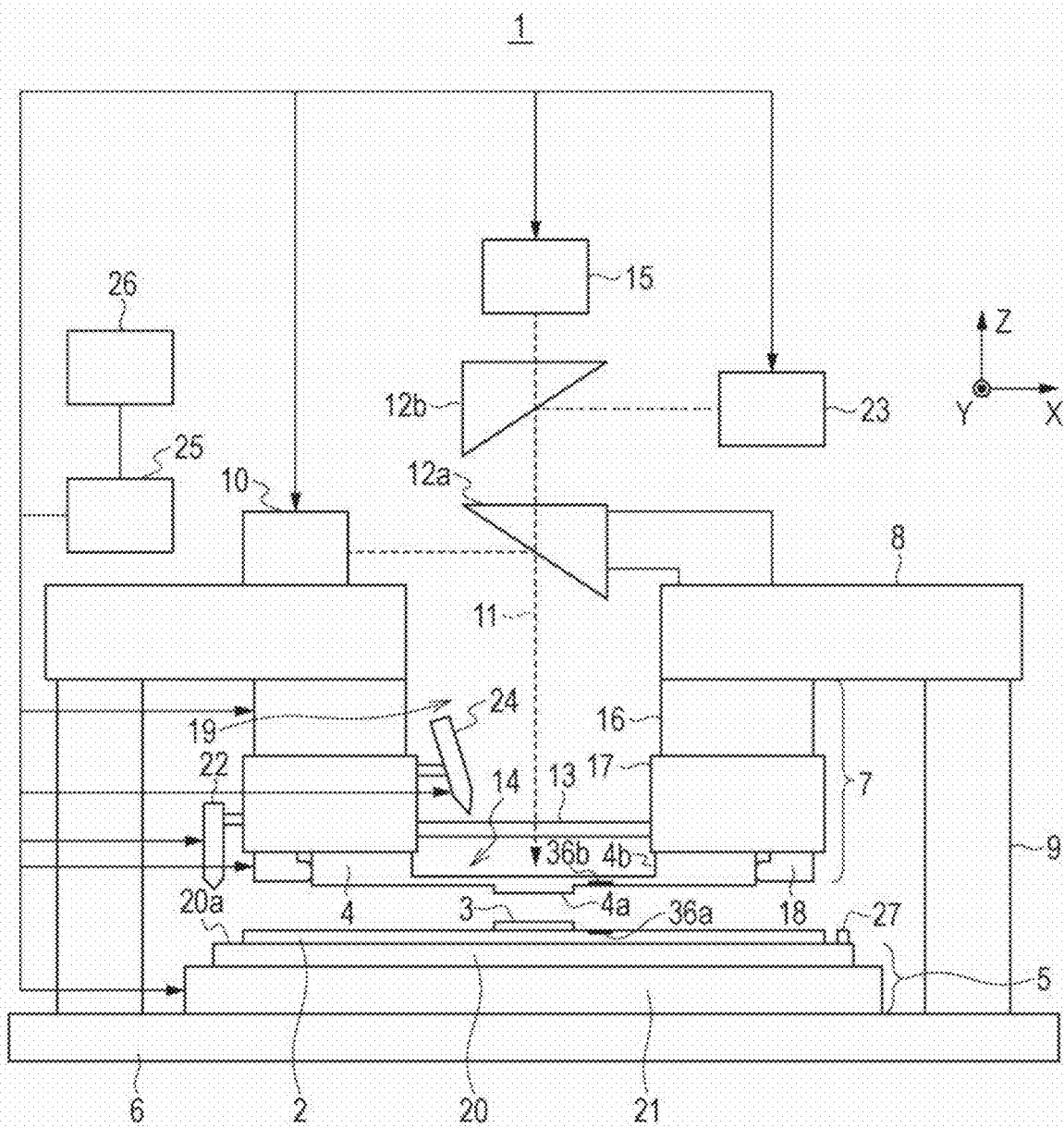
FIG. 1 illustrates a configuration of an imprint apparatus of a first exemplary embodiment.

FIG. 1 illustrates a configuration of an imprint apparatus 1 according to a first exemplary embodiment of the invention. An axis in a vertical direction is defined as a Z-axis and two axes which are orthogonal to each other in a plane vertical to the Z-axis are defined as an X-axis and a Y-axis. The imprint apparatus 1 cures a photo-curable imprint material 3 coated on a substrate 2 while the imprint material 3 and a mold 4 are brought into contact with each other, releases the cured imprint material 3 and the mold 4, and forms a pattern of the imprint material 3 on the substrate 2.

The imprint apparatus 1 includes a base platen 6 on which a substrate stage 5 is placed, a bridge platen 8 for fixing a holding mechanism 7, and a strut 9 which extends in a vertical direction from the base platen 6 and supports the bridge platen 8. An illumination, unit 10 emits ultraviolet rays 11 used for curing in a horizontal direction. The ultraviolet rays 11 are reflected on an optical element (for example, a dichroic mirror) 12a vertically and downwardly, and illuminated onto the substrate 2 through the mold 4.

The mold 4 has an outer periphery in a rectangular shape, and has a pattern portion 4a, on which a concave-convex pattern is formed, at a center portion thereof. On the substrate 2, with a single mold pressing operation, a pattern of the imprint material 3 is formed in a pattern region (region to be processed) 31 having the same size as a size of the pattern portion 4a.

In the present exemplary embodiment, the pattern region 31 has the same size as that of a shot region (region to be processed). The shot region is a unit region of a base layer in which the pattern has been already formed and a size of one shot region is, for example, about 26 mm×33 mm. One or more patterns having a chip size desired by a user are able to be formed in one shot region.

The mold 4 further has a cavity (concave) 4b having a circular outer periphery around the pattern 4a. A transmitting member 13 is arranged so that the ultraviolet rays 11 and heating light pass therethrough and a space 14 enclosed by a part of an aperture region and the cavity 4b is sealed. By regulating pressure in the space 14 by a pressure regulating device (not illustrated) when the pattern portion 4a is pressed against the imprint material 3, the pattern portion 4a is able to be deformed into a downwardly convex shape. This makes it possible to prevent a bubble from being mixed in the concave of the pattern portion 4a when the pattern portion 4a is filled with the imprint material 3.

When the imprint material 3 used for imprinting is photo-curable, the mold 4 needs to be formed of a material through which illumination light for curing is able to pass. Further, the material is required to pass heating light emitted from a heating mechanism (heating unit) 15 described below. For example, glasses such as quartz glass, silicate based glass, calcium fluoride glass, magnesium fluoride glass, and acrylic glass may be used. The material of the mold 4 may be sapphire, gallium nitride, and resin such as polycarbonate, polystyrene, acryl, and polypropylene. Alternatively, the material may be laminates comprising any of these materials.

The holding mechanism 7 has a mold chuck 16 for attracting and holding the mold 4 with a vacuum suction force and an electrostatic force, a driving mechanism 17 for moving the mold 4 with the mold chuck 16, and a deforming mechanism 18 for deforming the mold 4. At the center of each of the mold chuck 16 and the driving mechanism 17, an opening region 19 is provided so that the ultraviolet rays 11 from the illumination unit 10 reach the substrate 2.

The deforming mechanism 18 deforms the mold 4 into a target shape by horizontally applying external force to the mold 4. This makes it possible to reduce a difference between a shape of the pattern region 31 on the substrate 2 side (illustrated in FIGS. 4A to 4D) and a shape of the pattern portion 4a and improve overlay precision of the pattern to be formed.

The driving mechanism 17 moves the mold 4 in the Z-axis direction. Thereby, an operation of making the mold 4 and the imprint material 3 contact with each other (mold pressing) and an operation of releasing the mold 4 and the imprint material 3 (mold releasing) are performed. Examples of an actuator adopted for the driving mechanism 17 include a linear motor and an air cylinder. The driving mechanism 17 may be formed of a plurality of driving systems such as a coarse motion driving system and a fine motion driving system. The driving mechanism 17 may include a driving mechanism for moving the mold 4 not only in the Z-axis direction but also in the X-axis direction, the Y-axis direction, and a rotation direction around each of the axes. This makes it possible to perform positioning of the mold 4 precisely.

Inc substrate stage 5 has a chuck 20 serving as a substrate holding unit for attracting the substrate 2 to a holding surface 20a to hold the substrate 2, and a driving mechanism 21 for moving the substrate 2 with the chuck 20. "Attracting to hold" refers to a state where the chuck 20 is subjected to force other than gravity of the substrate 2 in the same direction as the gravity direction of the substrate 2. The substrate 2 may be held with the electrostatic force or force generated by mechanically pressing the substrate 2 in addition to the vacuum suction force. A reference mark 27 is provided on the substrate stage 5 and is used for alignment of the mold 4.

A patterning unit configured to form a transfer pattern of the pattern portion 4a in the pattern region. 31 has a unit configured to control at least mold pressing, curing of the imprint material 3, mold releasing, and the like. The patterning unit in the present exemplary embodiment includes at least the driving mechanism. 17, and the illumination unit 10. The pattern is formed while the heating mechanism 15 described below deforms the pattern region 31 based on an illumination profile created by a control unit 25.

Figure 2:
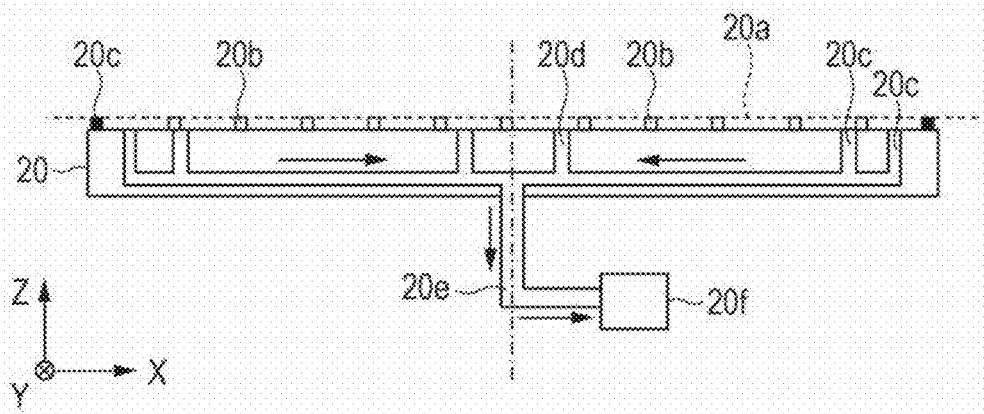
FIG. 2 illustrates a configuration of a chuck.

FIG. 2 is an enlarged view of the surroundings of the chuck 20. On a side of the chuck 20 on which the substrate 2 is held, a plurality of support materials 20b each having a pin shape, and one ring member 20c surrounding the support materials 20b are provided. The substrate 2 is placed on the support materials 20b and the ring member 20c. The chuck 20 further includes a plurality of holes 20d as illustrated in FIG. 2. A common pipe 20e leading to the holes is connected to a vacuum pump 20f and the vacuum pump 20f exhausts the inside of a region surrounded by the ring member 20c so as to allow attraction of the substrate 2 with the almost uniform suction pressure.

A surface virtually defined by leading edges of the support materials 20b and the ring member 20c is set as the holding surface 20a. Note that, the pipe 20c may be connected to a different vacuum pump 20f and have a mechanism allowing adjustment of the suction pressure for each of divided regions. A pattern fault caused at a time of detachment may be reduced by performing adjustment so as to decrease the suction pressure of a part of regions at a time of mold releasing.

The following description further explains FIG. 1. The driving mechanism. 21 moves the substrate 2 in an X-Y plane. Thereby, positioning of the mold 4 and the pattern region 31 serving as a base pattern on the substrate 2 is performed. Examples of an actuator adopted for the driving mechanism 21 include a linear motor and an air cylinder. The driving mechanism 21 may include a plurality of driving systems such as a coarse motion driving system and a fine motion driving system. The driving mechanism 21 may include a driving mechanism for moving the substrate 2 not only in the X-axis direction and the Y-axis direction but also in the Z-axis direction and a rotation direction around each of the axes. This makes is possible to perform positioning of the substrate 2 precisely.

In the course of a semiconductor process, the shape of the pattern region 31 is slightly deformed by combining deformation components such as a magnification component, a parallelogram component, and a trapezium component. The heating mechanism 15 of the present exemplary embodiment gives a heat value corresponding to an illumination profile to the pattern region 31 by controlling illumination of light. By heating and deforming the pattern region 31 so as to approximate the shape thereof to a target shape, a difference between the shape of the pattern region 31 and the shape of the pattern portion 4a is able to be reduced.

Figure 3:
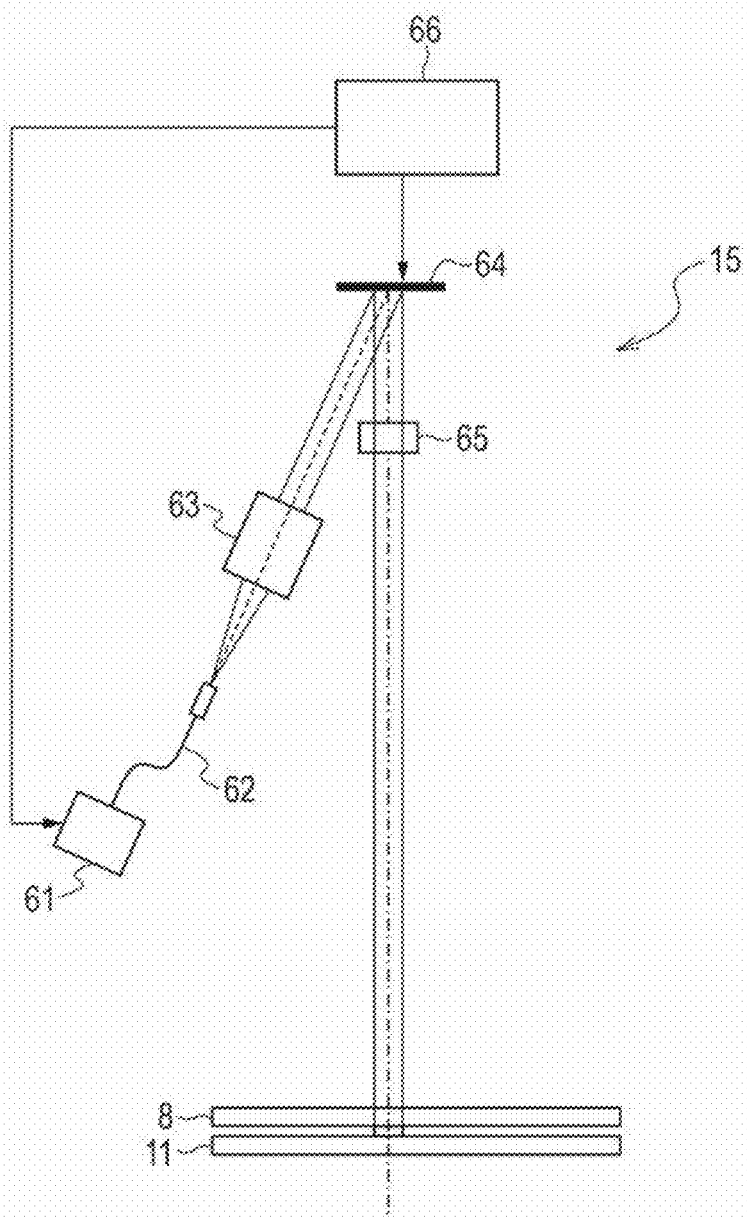
FIG. 3 illustrates a configuration, of a heating mechanism of the first exemplary embodiment.

FIG. 3 illustrates a configuration of the heating mechanism (heating unit) 15. A light source 61 emits heating light. A wavelength of the heating light is desired to be a wavelength by which the uncured imprint material 3 is not cured and which allows absorption as heat on the substrate 2. For example, the desired wavelength is 400 nm to 2000 nm. The heating light is incident on a DMD (Digital Micro-mirror Device) 64 through an optical fiber 62 and an optical system 63 and only the heating light selectively reflected by the DMD 64 is illuminated onto the substrate 2.

The optical element 12a which reflects the ultraviolet rays 11 emitted from the illumination unit 10 and pass the heating light therethrough is arranged in an optical path of the heating light. An optical element (for example, dichroic mirror) 12b which reflects light emitted from a light source of a monitor 23 used for observing filling of the imprint material 3 and passes most of the heating light therethrough is further arranged in the optical path of the heating light.

For example, a high-output semiconductor laser is used for the light source 61. The optical system 63 includes a collective optical system (not illustrated) for collecting light emitted from the light source 61, and a uniform illumination optical system (not illustrated) for uniformizing an intensity of light from the collective optical system and illuminating the DMD 64. The uniform illumination optical system includes an optical element, for example, such as a micro lens array (MLA) (not illustrated).

The DMD 64 includes a plurality of micro mirrors (not illustrated) for reflecting the heating light. An illumination control unit 66 is able to incline each of the micro mirrors at an angle of −12 degrees (on state) or +12 degrees (off state) to a surface on which the micro mirrors are arrayed.

The heating light reflected by the micro mirror in the on state is imaged on the substrate 2 by an optical projection system 65 which provides a conjugation relation between the DMD 64 and the substrate 2. The light reflected by the micro mirrors in the off state is reflected in a direction, not reaching the substrate 2. In the present exemplary embodiment, all sizes of regions in which the heating light reflected by the micro mirrors in the on state is reflected on the substrate 2 are the same as an ideal size of the pattern region 31. However, the sizes are not required to be necessarily the same and the sizes of the regions in which the heating light is projected on the substrate 2 may be larger than the ideal size of the pattern region 31.

When the heating mechanism 15 causes distribution of a region in which the heating light is illuminated and a region in which the heating light is not illuminated in one pattern region 31, it is possible to locally deform the pattern region 31.

The illumination control unit 66 has a CPU and selectively controls switching of the on state and the off state of each of the micro mirrors based on an illumination profile (heating distribution data indicating heating distribution) instructed from the control unit (generation unit, obtaining unit) 25 described below.

The illumination profile is a profile indicating, for example, temporal and spatial heating distribution by the on state and the off state of each of the micro mirrors. The illumination profile includes information about times of the on state and the off state, and illumination distribution according to a position in the pattern region 31 formed by the distribution of the on state and the off state. As the number of micro mirrors in the on state increases and as an illumination time of the heating light becomes long, a greater heat value is able to be applied to the pattern region 31 on the substrate 2.

FIGS. 4A to 4D illustrate one example of relationships between the illumination profile and the pattern region 31. As illustrated in FIG. 4A, the pattern region 31 is distorted by including a trapezium component only in one direction (X-direction). In order to reduce a difference from the shape of the pattern portion 4a, it is necessary to approximate the shape of the pattern region 31 to a rectangle 30 by expanding an upper side. In this case, as the illumination profile illustrated in FIG. 4B, the illumination distribution and the illumination time are set so that the illumination amount applied to a vicinity of the upper side increases. That is, illumination, distribution 32 is formed only in the Y-direction and uniform illumination is provided in the X-direction.

When the heating light is illuminated based on the illumination distribution 32 illustrated in FIG. 4B, temperature distribution 33 illustrated in FIG. 4C is formed in the pattern region 31 and the shape of the pattern region 31 changes with displacement distribution 34 illustrated in FIG. 4D. This makes it possible to correct the shape of the pattern region 31 as illustrated in FIG. 45. When the pattern region 31 has only isotopic magnification component, the illumination profile is only required to allow providing of uniform temperature distribution in the pattern region 31.

An element other than the DMD 64 may be used as long as an element capable of deforming the pattern region 31 with distribution in the same manner as the DMD 64. For example, an LCD (Liquid Crystal Display) may be used.

The following description further explains the imprint apparatus 1 with reference to FIG. 1. A coating unit 22 coats the pattern region 31 on the substrate 2 with the imprint material 3 in the uncured state. Only an amount of the imprint material 3 needed for single operation of mold pressing operation is used for single coating. Therefore, each time the mold pressing operation is finished, the substrate stage 5 reciprocates the substrate 2 between a position of the mold pressing and a lower position of the coating unit 22.

On the monitor 23, a situation where the pattern portion 4a of the mold 4 is filled with the imprint material 3 is observed by using light. This makes it possible to specify that a foreign substance is caught by the pattern portion 4a or specify a portion not filled with the imprint material 3.

An alignment system (detection unit) 22 detects at least a plurality of marks 36a provided in the pattern region 31. In the present exemplary embodiment, the marks 36a provided around the pattern region 31 and marks 36b provided in the pattern portion 4a are detected simultaneously. The detection of the marks 36a and 36b is performed before and after the mold 4 and the imprint material 3 on the substrate 2 are brought into contact with each other.

Note that, the marks used for positioning may be changed before and after the mold 4 and the imprint material 3 are brought into contact with each other.

The marks 36a are only required to allow grasping of the shape of the pattern region 31 by detection of the plurality of marks 36a. The marks 36a may be formed in the pattern region 31, or may be formed on a scribe line adjacent to the pattern region. 31 as described above. The alignment system 24 includes a plurality of scopes and detects the plurality of marks 36a and 36b simultaneously.

Based on a detection result of the alignment system 24, the control unit 25 described below obtains positional shifts (shift components) of the marks 36a and 36b in the X-axis direction, the Y-axis direction, and the ωZ-direction. The control unit 25 further obtains an amount of change in the shape of the magnification component of the pattern region 31. Moreover, based on positional changes of the marks 36a before and after the heating mechanism 15 thermally deforms the substrate 2, the control unit 25 is able to obtain the amount of change in the shape of the pattern region 31 (second information about deformation of the region to be processed, second information about thermal deformability).

The control unit 25 is connected to the illumination unit 10, the heating mechanism 15, the monitor 23, the holding mechanism. 7, the substrate stage 5, the coating unit 22, the alignment system 24, and a storage unit 26 through a line, and integrally controls the aforementioned control targets. Patterns are formed successively by repeating the mold pressing operation with respect to a plurality of pattern regions 31 on the substrate 2.

The control unit 25 executes programs stored in the storage unit 26, which are illustrated in flowcharts of FIG. 6 and FIG. 7 described below, by controlling the aforementioned control targets connected to the control unit 25. The control unit 25 reads a variable needed for the control of the control targets from the storage unit 26 or stores the variable in the storage unit 26.

The control unit 25 may be disposed in a housing commonly used with other components of the imprint, apparatus 1, or may be disposed outside the housing. The control unit 25 may be an aggregation of control substrates different for each of the control targets.

The control unit 25 has a function as an obtaining unit which obtains first information and second information. The first information is information defined based on a difference of the shapes of the pattern region 31 and the pattern portion 4a, and the second information is information about a deformation amount of the pattern region 31 obtained by trying deformation of the pattern region 31 by the heating mechanism 15 while the chuck 20 is attracting the substrate 2. The control unit 25 further has a function as a generation unit which generates an illumination profile used for pattern formation based on the first information and the second information.

In particular, the first information according to the present exemplary embodiment is a standard illumination profile defined based on a difference between the shape of the pattern portion 4a and the shape of the patter region 31, which is obtained based on the detection result of the marks 36a and 36b by the alignment system 24. The standard illumination profile is also referred to as first information defined based on a difference of the shapes of the pattern region 31 and the pattern portion 4a of the mold 4. The standard illumination profile is also referred to as temporal heating distribution data temporarily generated based on the difference of the shapes of the pattern region 31 and the pattern portion 4a of the mold 4.

The second information according to the present exemplary embodiment is a correction value (correction coefficient) for correcting the standard illumination profile. The heating mechanism 15 heats the pattern region 31 based on an illumination profile obtained by correcting the standard illumination profile to thereby deform the pattern region 31 so as to reduce the difference between the shape of the pattern region 31 and the shape of the pattern portion 4a.

The "standard illumination profile" is an illumination profile defined based on the difference of the shapes of the pattern portion 4a of the mold 4 and the pattern region 31 and the deformation amount of the substrate 2 per unit heat value in a state where the chuck. 20 does not suck the substrate 2 (or a state of uniformly sucking the substrate 2).

That is, the same standard illumination profile is allocated to the pattern regions 31 having the same shape.

Figures 5A, 5B:
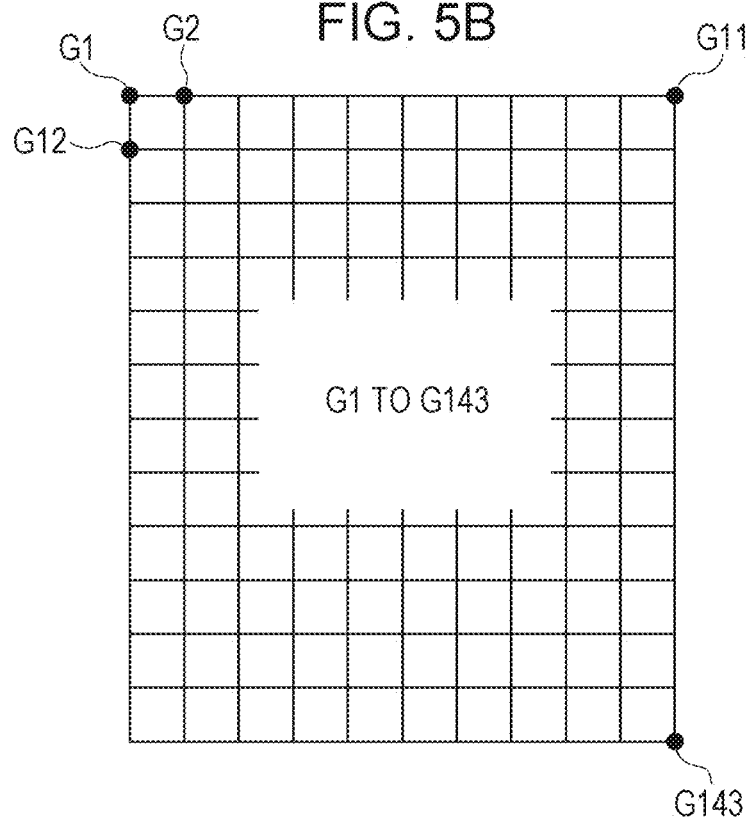
FIGS. 5A and 5B are diagrams for explaining sections in a pattern region.
Figure 9:
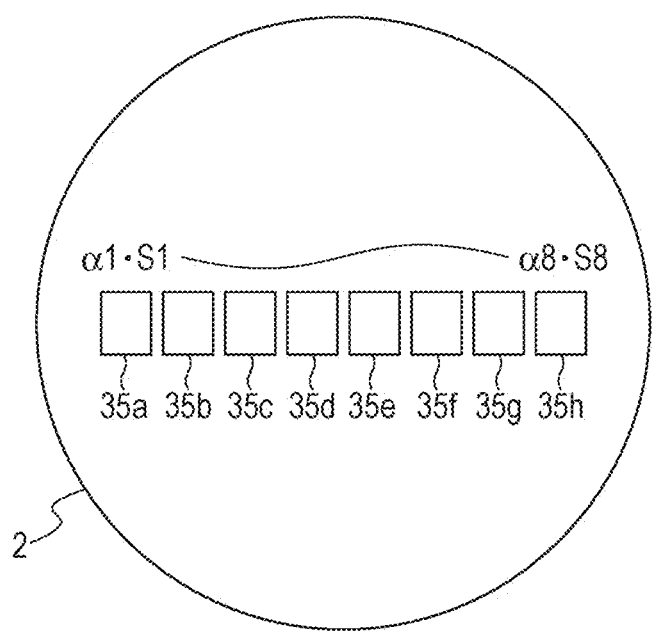
FIG. 9 is a diagram for explaining a correction method of the first exemplary embodiment.

A method for generating the standard illumination profile by the control unit 25 will be described. As illustrated in FIG. 5A, 9×11 sections A1 to A99 sectioned by each lattice are provided for illuminating the region of the pattern region 31 with light having illumination distribution. By defining illumination independently to each of the sections, the illumination distribution is able to be formed. Further, 11×13 lattice points G1 to G143 illustrated in FIG. 5B indicate respective positions in the pattern region 31. A mark for overlay inspection is arranged at each of the lattice points.

When a matrix dX is a matrix indicating a position shift amount at each lattice point G between the shape of the pattern portion 4a and the pattern region 31, a matrix Ax is a matrix indicating a displacement amount of each lattice point. G per unit control amount of each section, and a matrix C is a control amount for each section, $dX-\Delta x*C$ is calculated. A result of the calculation is a matrix indicating a residual of correction of the shape at each lattice point G.

The control unit 25 calculates the matrix C in which a sum of squares of the respective elements of the corresponding matrix is the smallest. Note that, the matrix Ax and the matrix C include, as the control amount, force applied to the mold 4 by the deforming mechanism 18, and a heat value to be applied by the heating mechanism 15 to a position corresponding to each section of the pattern region 31. Thereby, the force applied to the mold 4 and the heat value to be applied to each section are calculated.

Figure 6:
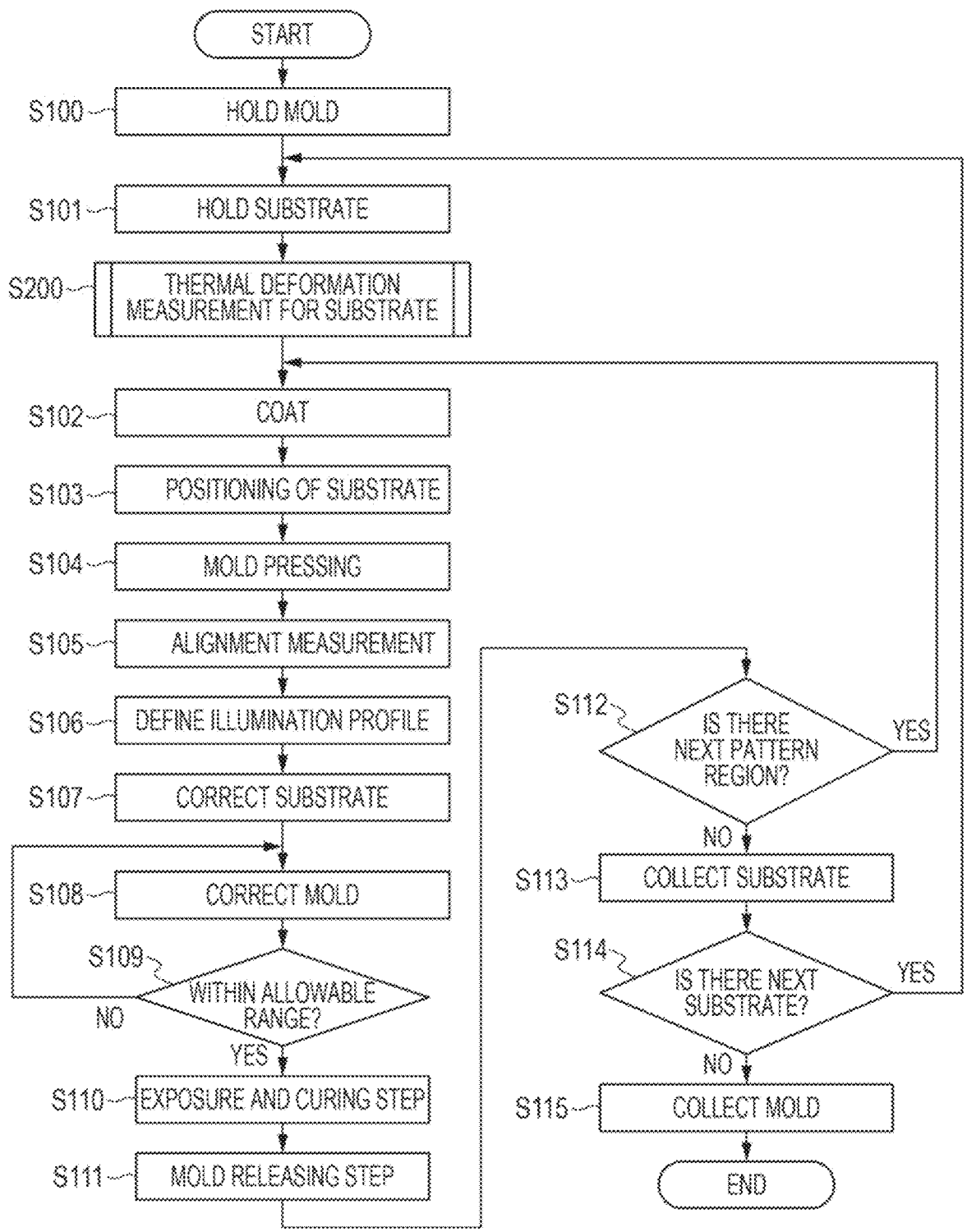
FIG. 6 is a flowchart illustrating a flow of a measurement method.

The storage unit 26 stores therein the programs illustrated in the flowcharts of FIG. 6 and FIG. 7, and a deformation amount of the substrate 2 per unit heat value. The storage unit 26 stores therein the detection result by the alignment system 24, and a position of the pattern region 31 for correcting the standard illumination profile and an amount of change in the shape of each pattern region 31, which are obtained by thermal deformation measurement described below, during a consecutive operation for pattern formation. Further, the storage unit 26 stores therein a correction amount of the illumination profile for each pattern region 31, which is obtained by the control unit 25.

(Imprint Method)

Next, an imprint method according to the present exemplary embodiment will be described. The present exemplary embodiment is an exemplary embodiment in which a required illumination profile varies between the pattern regions 31 and thermal deformation measurement is performed before mold pressing (before making the mold and the imprint material contact with each other) in the operation for pattern formation.

Note that, the "operation for pattern formation" in the following description refers to an operation from when one pattern region 31 is coated with the imprint material 3 until a mold releasing step of detaching the mold from the imprint material 3 is performed after a mold pressing step and a curing step are performed. The "thermal deformation measurement" refers to an operation for measuring the deformation amount of the shape of the pattern region 31 when the substrate 2 is thermally deformed while the chuck 20 is sucking (attracting) the substrate 2.

FIG. 6 is a flowchart illustrating a flow until a pattern is formed on all the substrates 2 in the same lot. The lot refers to an aggregation of a plurality of substrates 2 on which the same pattern is formed and which have been subjected to the same processing step (such as etching) under the same condition. Normally, twenty-five substrates 2 are provided per one lot in many cases. At a starting point of the flowchart, it is set that neither the mold 4 nor the substrate 2 is mounted in the imprint apparatus 1.

First, the control unit 25 causes the mold chuck 16 to hold the mold 4 by suction (S100). After S100 or simultaneously with S100, the control unit 25 causes the chuck 20 to hold the substrate 2 by suction (S101). Then, while maintaining the sucked state, the control unit 25 performs thermal deformation (trying deformation) for the substrate 2 by using the heating mechanism 15 and controls the alignment system 24 to perform thermal deformation measurement of the pattern region 31 (S200). At a trying deformation step in the step of S200, since the substrate 2 is deformed with the standard illumination profile, the curing step of the imprint material 3 is not performed.

With a measurement step of S200, the control unit 25 obtains a correction value for correcting the standard illumination profile (second information about deformation of a region to be processed) for each pattern region 31. The step of S200 will be described specifically below.

The control unit 25 controls the substrate stage 5 to drive the substrate 2 to a coating position of the imprint material 3 and causes the coating unit 22 to coat the pattern region 31 subjected to mold pressing first with the imprint material 3 (S102). The control unit 25 controls the substrate stage 5 to move the substrate 2 to a position facing the mold 4 (hereinafter, referred to as a mold pressing position) (S103). The control unit 25 controls the holding mechanism 7 to lower and press the mold 4 to the imprint material 3 (S104).

The alignment system 24 detects the marks 36a and 36b (S105), and slightly drives the substrate stage 5 to relatively position the mold 4 and the substrate 2. The control unit 25 obtains a difference between the pattern portion 4a and the pattern region 31 based on a detection result at S105. Thereby, the control unit 25 obtains the condition for correction of the shape of the mold 4 by the deforming mechanism 18, and a standard illumination profile for correction of the shape of the pattern region 31.

Further, by using the standard illumination profile and the correction value for correcting the standard illumination profile obtained at the step of S200, an illumination profile needed for thermal deformation of the pattern region 31 is defined (S106).

Subsequently, the control unit 25 controls the heating mechanism 15 to heat the inside of the pattern region 31 in accordance with the illumination profile defined at the step of S106 (S107). Thereby, a temperature of the pattern region 31 locally increases by about 1 degree at maximum. The substrate 2 is locally deformed by heating and the pattern region achieves a target shape. After S106 or simultaneously with S106, the control unit 25 controls the deforming mechanism 18 of the mold 4 to mechanically deform the mold 4 to a target shape (S108). Note that, though the pattern region 31 is heated also at the step of S200, the deformation caused at the step of S200 is returned to an original state in around several seconds.

At the steps of S107 and S108, the control unit 25 causes the alignment system 24 to detect the marks 36a and 36b simultaneously. Based on the detection result, the control unit 25 judges whether a residual of the shape of the pattern region 31 and the shape of the pattern portion 4a is within an allowable range (S109). When judging that the residual of the shapes is not within the allowable range (NO), the control unit 25 further corrects the shape of the mold 4 by returning to S108.

When judging that the residual of the shapes is within the allowable range (YES), the control unit 25 controls the illumination unit 10 to illuminate the pattern region 31 with the ultraviolet rays 11 as an exposure step (S110). At a timing when the imprint material 3 is cured by the illumination of the ultraviolet rays 11 and the curing of the imprint material 3 is finished, the mold 4 is detached from the imprint material 3, so that a pattern is formed on the substrate 2 (S111).

(Patterning Step)

The control unit 25 judges whether or not the same substrate 2 has the pattern region 31 in which the pattern is to be formed continuously (S112). When the control unit 25 judges that there is no corresponding pattern region 31 (NO at S112), the substrate 2 on the chuck 20 is carried out by a conveying mechanism (not illustrated) (S114).

When the control unit 25 judges that there is the corresponding pattern region 31 (YES at S112), the steps S102 to S112 are repeated. After the substrate 2 is carried out at S114, whether or not there is the substrate 2 to be processed with the same mold 4 is judged (S115), and when it is judged that there is the substrate 2 to be processed (YES at S115), the steps S101 to S114 are repeated.

(About Thermal Deformation Measurement)

Next, the thermal deformation measurement step of S200 will be described with reference to FIG. 7 to FIGS. 10A to 10D. FIG. 7 is a flowchart illustrating a flow of the thermal deformation measurement for the substrate 2 at S200. The control unit 25 executes the program illustrated in this flowchart based on an instruction of the control unit 25.

Before the program is started, a plurality of representative pattern regions (hereinafter, referred to as representative pattern regions) 35 (35a to 35h) are selected from among all the pattern regions 31 formed on the substrate 2. The eight representative pattern regions 35a to 35h (refer to FIG. 9) which pass the center of the substrate 2 and are arranged in the X-axis direction are selected and stored in the storage unit 26 in advance.

At the thermal deformation measurement step of S200, first, the control unit 25 judges whether the substrate 2 held by the chuck 20 is the substrate 2 to be measured (S201). When judging that the substrate 2 is not the substrate 2 to be measured (NO at S201), the control unit 25 proceeds to the step of S209 at which the correction value of the standard illumination profile stored in the storage unit 26 is read, and finishes the step of S200.

When judging that the substrate 2 is the substrate 2 to be measured (YES at S201), the control unit 25 causes the alignment system 24 to detect the marks 36a indicating the position of the representative pattern region 35a. Subsequently, the pattern region 35a is heated with the uniform amount of illumination and deformed (S202).

The control unit 25 causes the alignment system 24 to detect the marks 36a indicating the position of the representative pattern region 35a (S203). The marks 36a to be detected are at least four marks 36a indicating positions of four corners of the pattern region. By measuring the four marks 36a, distortion of the magnification component of the pattern region 31 is measured.

After heating is finished (S204), the control unit 25 obtains a deformation amount based on the detection result by the alignment system 24 before and after heating at S205. The control unit 25 saves the deformation amount together with the position of the representative patter 35a on the substrate 2 in the storage unit 26 (S205) (obtaining step). Then, the control unit 25 judges whether or not there is a next representative pattern region to be measured (S206). When the control unit 25 judges that there is a next representative pattern region (YES at S206), the steps of S202 to S206 are repeated until measurement for the representative patterns 35a to 35h is finished.

Lastly, a correction value of an illumination profile of each of the pattern region 31 is obtained (S207).

Figure 8A:
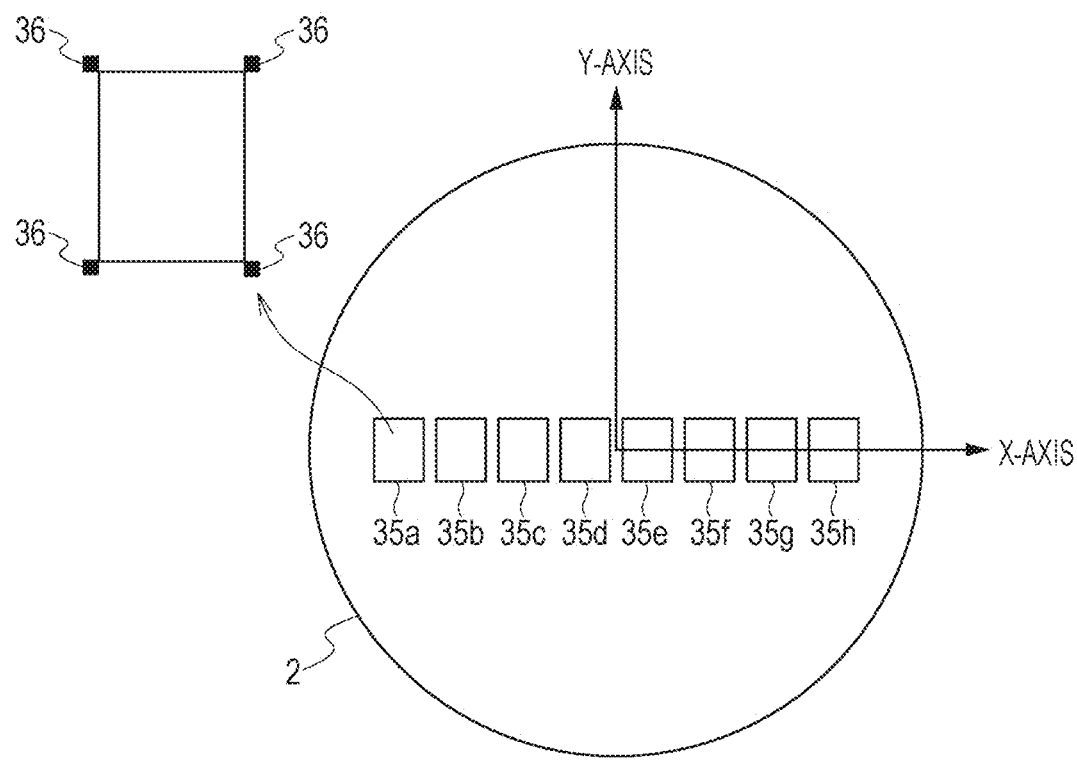
FIGS. 8A and 8B illustrate an example of a measurement result.
Figure 8B:
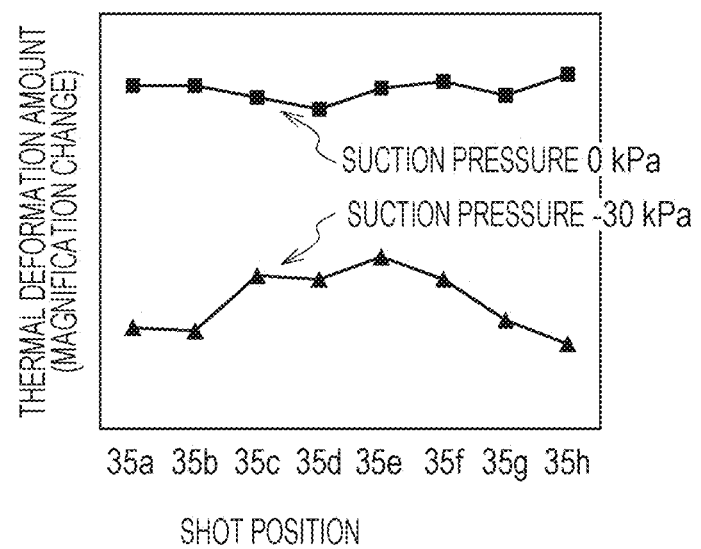

FIG. 8B illustrates one example of the deformation amount saved at S206 as to each of the representative pattern regions 35a to 35h. An axis of ordinates indicates a thermal deformation amount. The thermal deformation amount is a value represented by a ratio of a distance between two marks 36a after heating, which are arranged in the X-axis direction, to a distance between the marks 36a before heating. FIG. 8B illustrates a case where the suction pressure is −30 kPa, and a case where the suction pressure is 0 kPa as a comparative example.

As illustrated in FIG. 8B, the thermal deformation has a greater variation in a case where the suction pressure of the chuck 20 is −30 kPa compared to a case where the suction pressure is 0 kPa. Moreover, when the suction pressure is −30 kPa, the representative pattern regions 35d, 35e, and the like on the center side of the substrate 2 have the greater thermal deformation amount than the representative pattern regions 35a, 35h, and the like in the periphery of the substrate 2.

Since the suction force of the chuck 20 acts, as frictional force, in a direction in which the substrate 2 is prevented from being thermally deformed, there is a difference in the thermal deformation amounts caused by a difference of the suction pressures. Further, due to flatness of the holding surface 20a or warping and waviness of the substrate 2, the thermal deformation has distribution according to the positions of the pattern regions 35a to 35h. This is because the frictional force acting in the direction in which the thermal deformation is prevented has distribution since a contact pressure between the holding surface 20a and the substrate 2 does not become uniform depending on the positions. Another reason is, for example, that a degree at which the heat applied to the substrate 2 escapes to the chuck 20 has distribution.

Finally, the control unit 25 obtains a correction value αn of the standard illumination profile corresponding to all the pattern regions 31 based on the obtained positions of the pattern regions 35a to 35h and the obtained deformation amounts of the pattern regions 35a to 35h (S208).

Specifically, by functionally approximating the deformation amounts in the representative pattern regions 35a to 35h for interpolation, distribution indicating the positions of all the pattern regions 31 and the thermal deformation amounts corresponding to the positions of the pattern regions 31 is formed. The correction value αn (α1 to α8) of the standard illumination profile is defined as a value standardized by a predetermined method. For example, the deformation amount of a certain pattern region 31 may be defined as "1" and the deformation amount of other pattern region 31 may be standardized based on the deformation amount defined as "1".

The correction value αn is only required to be information about thermal deformability. That is, the correction value αn includes not only the standardized value described above but also a value itself of the deformation amount due to heating and the deformation amount per unit heat value, which is obtained by dividing each of the deformation amounts by the applied heat value. The correction value αn can also includes the value obtained by standardizing the deformation amount per unit heat value. Moreover, discrete values or consecutive values may be used for the distribution of the correction amount according to the positions, which is obtained by functional approximation. Thereby, the thermal deformation measurement step S200 ends.

The control unit 25 uses the correction value αn obtained by the thermal deformation measurement to define the illumination profile needed for each of the pattern regions 31 as described above (S106 of FIG. 6). Based on a difference between a desired deformation amount and an actual deformation amount, the control unit 25 defines the illumination profile in which the difference becomes small for each of the pattern regions 31.

The control unit 25 may define, for each of the pattern regions 31, heating distribution obtained by multiplying the standard illumination profile obtained by the alignment measurement at S105 by the correction value αn obtained at the step of S208. Note that, multiplying the standard illumination profile by the correction value αn means multiplying the heat value allocated to each section of the heating distribution indicated by the standard illumination profile by the correction value αn. When the standard illumination profile about the representative pattern region 35a is S1, the illumination profile of the representative pattern region 35a is α1×S1. Similarly, αn×Sn (n=2 to 8) is set for each of the representative pattern regions 35b to 35h.

In the present exemplary embodiment, the representative pattern region 35 is heated and deformability per unit heat value is obtained before the operation of pattern formation. Then, the correction value of the standard illumination profile needed during the operation of pattern formation is obtained for each of the pattern regions 31. This makes it possible to perform the operation of pattern formation while considering thermal deformability, which varies depending on the position on the substrate 2, caused by, for example, degree of contact of the chuck 20 and the substrate 2. Thus, it is possible to reduce an overlay error in each of the pattern regions 31 and improve overlay precision in the entire substrate 2.

Second Exemplary Embodiment

A configuration of the imprint apparatus 1 according to a second exemplary embodiment of the invention is similar to that of the first exemplary embodiment. The second exemplary embodiment is different from the first exemplary embodiment in a method for selecting the representative pattern region 35 to be measured in thermal deformation measurement at S200. In the printing apparatus 1, tendency as to which region of the substrate 2 has the same deformation amount per unit heat value is measured before the thermal deformation measurement.

Figure 10A:
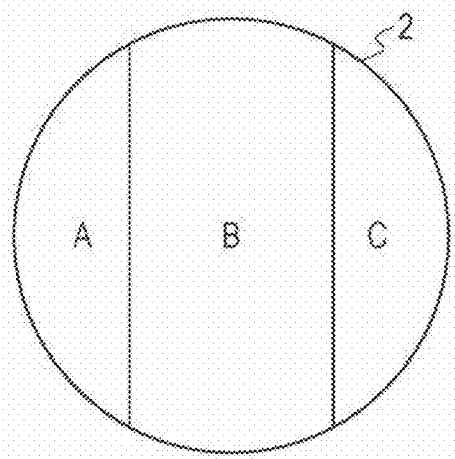
FIGS. 10A to 10D illustrate an imprint method of the first exemplary embodiment.

In the first exemplary embodiment, the pattern region 31 at the same X-position as the representative pattern region 35 is selected on the assumption that the pattern region 31 is deformed in the same manner as the representative pattern region 35. One pattern region per one region of a region A, a region B, and a region C of FIG. 10A is selected as the representative pattern region 35 in the present exemplary embodiment. It is assumed that the deformation amount per unit heat value is almost the same in the same region. Distribution of the position of the pattern region 31 and the correction value of the illumination profile is obtained based on a measurement result for the representative pattern region 35.

Figure 10B:
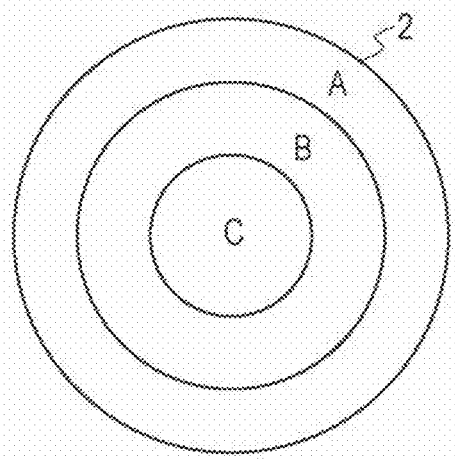
Figure 10C:
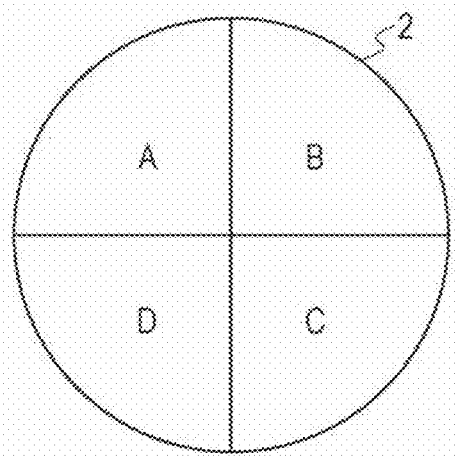
Figure 10D:
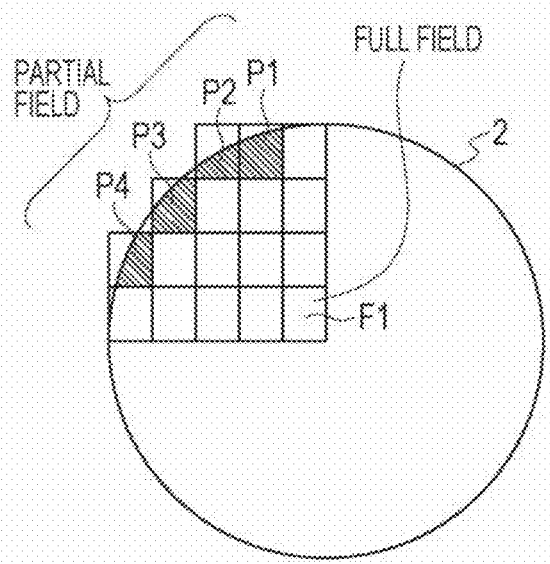

A modified example of the second exemplary embodiment is illustrated in FIGS. 10B to 10D. In FIG. 10B the regions having the same deformation amount per unit heat value are defined as a region A, a region B, and a region C concentrically from the outer periphery of the substrate 2.

When the thermal deformability of the substrate 2 has a tendency in concentric form, the pattern regions at positions having different distances from the center of the substrate 2 may be selected as the representative pattern regions 35 subjected to the thermal deformation measurement. In FIG. 10C, the regions having the same deformation amount per unit heat value are defined as four regions of a region A, a region B, a region C, and a region D each having a central angle of 90 degrees.

FIG. 10D illustrates a method for selecting the representative regions 35 when dividing into a full field in which the pattern region falls within the substrate 2 and a partial field in which the pattern region is out of the substrate 2 (the pattern region extending to the outer periphery portion of the substrate 2). In the full field, the pattern region in the center of the substrate 2 is defined as the representative pattern region 35. In the partial field, pattern regions each extending differently from the substrate 2 are defined as the representative pattern regions 35.

In this manner, there are three or more pattern regions 31 on the substrate 2. The alignment system 24 detects the marks 36a corresponding to at least two representative pattern regions 35 among these pattern regions 31. With a result of the detection, correction values of the illumination profile corresponding to the positions of other pattern regions 31 (distribution of the correction values) are able to be obtained. Similarly to the first exemplary embodiment, it is possible to reduce an overlay error in each of the pattern regions 31 and improve overlay precision. Further, compared to a case where the thermal deformation measurement is performed for all the pattern regions 31, a time required for the thermal deformation measurement is able to be reduced.

Note that, the correction value of the illumination profile needed for the representative pattern regions 35 may be applied directly in the same region. In the exemplary embodiment illustrated in FIGS. 10A to 10D, a plurality of pattern regions may be selected as the representative pattern regions 35 from the same region. When the thermal deformation amounts of the plurality of pattern regions in the same region are measured, an average value thereof may be used as the thermal deformation amount of the representative pattern regions 35.

Third Exemplary Embodiment

A third exemplary embodiment of the invention is an exemplary embodiment in which thermal deformation measurement is performed while mold pressing is being performed (after the mold and the imprint material are brought into contact with each other). A difference from the imprint apparatus 1 of the first exemplary embodiment is that a program illustrated in a flowchart of FIG. 11 is stored in the storage unit 26 instead of the program illustrated in the flowchart of FIG. 7.

The storage unit 26 further stores therein a reference deformation amount of the substrate 2 per unit heat value (thermal deformability when assuming that thermal deformability does not vary depending on positions). The deformation amount is, for example, a deformation amount calculated from a heat conductivity and an applied heat value of the substrate 2, or a deformation amount per unit heat value of one representative pattern region 31.

Figure 11:
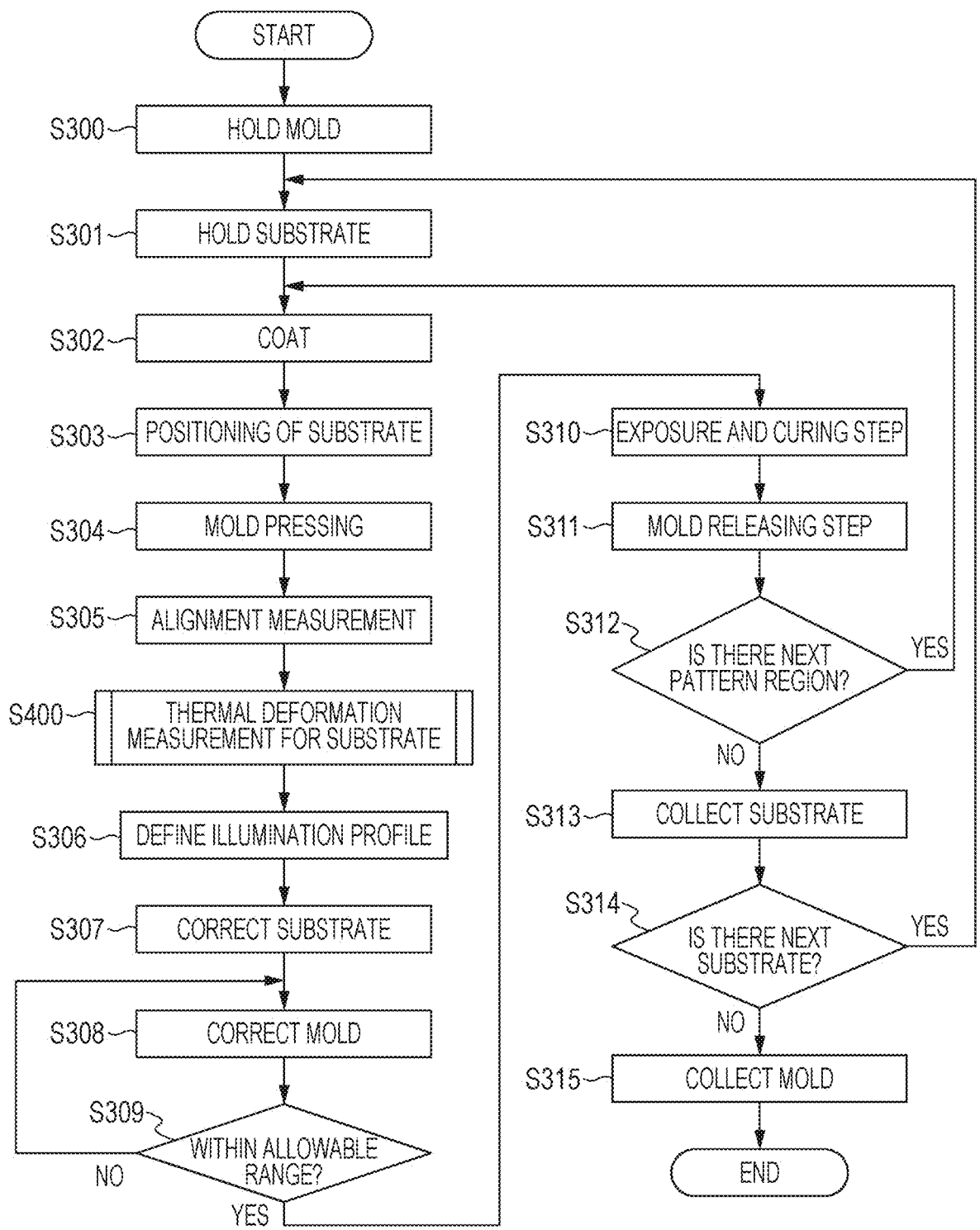
FIG. 11 is a flowchart for explaining a correction method of a second exemplary embodiment.

Steps at S300 to S305 in the flowchart of FIG. 11 are similar to the steps at S101 to S105 in the flowchart of FIG. 6. Without performing the thermal deformation measurement before a coating step (S302), the control unit 25 detects the marks 36a and 36b by alignment measurement while pressing the mold (S305), and then heats the substrate 2 to execute the thermal deformation measurement (S400). With the measurement at S400, a correction value for correcting the illumination profile is obtained.

Figure 12:
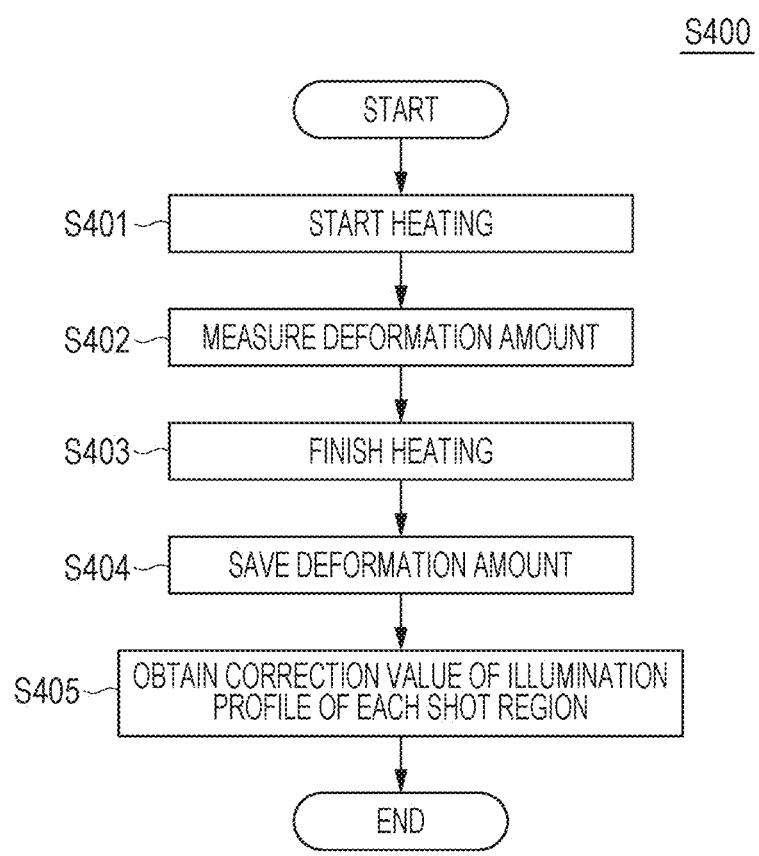
FIG. 12 is a flowchart illustrating an imprint method of a third exemplary embodiment.

The step at S400 will be described with reference to a flowchart of FIG. 12. The hating mechanism 15 heats the entire pattern region 31 with a uniform illumination amount for deformation while making the mold 4 contact with the imprint material 3 (S401). The control unit 25 causes the alignment system 24 to detect the marks 36a (S402). The marks 36a to be detected are at least four marks 36a indicating positions of four corners of the pattern region 31.

After the heating is finished (S403), the control unit 25 obtains the deformation amount based on the detection result by the alignment system 24. The control unit 25 saves the obtained deformation amount in the storage unit 26 with the position of the pattern region 31 (S404). Finally, the control unit 25 obtains the correction value of the illumination profile needed at a time of thermal correction of the shape of the pattern region 31 in the operation of pattern formation (S405).

The following description further explains FIG. 11. The control unit 25 defines the illumination profile needed for the thermal deformation of the pattern region 31 by using the standard illumination profile and the correction value for correcting the illumination profile obtained at the step of S400 (S306). Based on the illumination profile obtained at S306, the heating mechanism 15 causes the pattern region 31 to have target temperature distribution to correct the shape of the pattern region 31 (S307).

There is a case where time required for the steps S400 to S307 is short and the effect of the heat applied at S307 remains in the substrate 2. In this case, when reduction in throughput is in an allowable range, the shape correction at S307 may be performed by waiting until temperature of the substrate 2 is brought into a stationary state after the thermal deformation amount is measured.

When the reduction in the throughput is not allowed, the control unit 25 defines the illumination profile in consideration of the heat value remaining in the substrate 2 at S306. Alternatively, the control unit 25 may offset the effect of the remaining heat with respect to the illumination profile obtained without considering the effect of the remaining heat and the heating mechanism 15 may perform correction by changing illumination of the light source 61 or correction of the illumination profile.

Since the steps of S308 to S315 are the same as the steps of S108 to S115 of the first exemplary embodiment, description thereof will be omitted below.

In the present exemplary embodiment as well, the correction value of the standard illumination profile of the pattern region 31 needed for the operation of pattern formation is obtained by performing thermal deformation measurement. By correcting the illumination profile for each pattern region 31 based on a result of the measurement, it is possible to reduce an overlay error in each of the pattern regions 31 and improve overlay precision.

Though the substrate 2 needs to be moved to a mold pressing position once after the substrate 2 is carried in in the first exemplary embodiment, the substrate 2 is able to be moved to a position opposing the coating unit 22 immediately after the substrate 2 is carried in the present exemplary embodiment. Thus, it is possible to improve throughput by reducing the amount of time for moving the substrate stage 5. When the thermal deformation is executed after filling the pattern portion 4a with the imprint material 3, there is also an advantage that observation is not prevented by the heating light coming into a field of view of the monitor 23.

When the reference deformation amount of the substrate 2 per unit heat value is not stored in the storage unit 26, other correction values of the illumination profile needed at S405 may be obtained with the thermal deformation amount obtained at the step of S400 when a pattern is formed in the first one as a reference. The measurement step at S400 may be executed only in the representative pattern regions 35. When the regions having the same deformation amount per unit heat value are assumed as in the first and second exemplary embodiments above, it is possible to reduce time required for the thermal deformation measurement by applying the same correction value to divided regions.

Fourth Exemplary Embodiment

In a fourth exemplary embodiment, a shape difference between the pattern portion 4a and the pattern region 31 is measured with respect to all the pattern regions 31 in advance before a mass production step of forming a pattern successively on the substrate 2 for mass production (for example, before executing the processing illustrated in the flowcharts of FIG. 6 and FIG. 11). The standard illumination profile needed for each of the pattern regions 31 is defined before the mass production step. Relationships between the standard illumination profile to be applied and the change in the shape of the substrate 2 by the standard illumination profile is obtained also by using an overlay inspection apparatus. When a plurality of substrates 2 are used, an average value of the changes in the shapes thereof is also calculated.

In the fourth exemplary embodiment, thermal deformation measurement is performed simultaneously with or before and after such a step of obtaining the standard illumination profile. A method of the thermal deformation measurement is similar to the description for S200 and S400. Thereby, for example, after S101 and before S102 in the flowchart of FIG. 6, the illumination profiles needed for all the pattern regions 31 are able to be defined.

In the present exemplary embodiment as well, the correction value of the standard illumination profile needed during the operation of pattern formation is obtained for each of the pattern regions 31. This makes it possible to improve overlay precision in the pattern regions 31, and improve overlay precision in the entire substrate 2 by reducing an overlay error in each of the pattern regions 31. It is also possible to ensure sufficient time for obtaining the illumination profiles before the mold pressing operation starts.

Fifth Exemplary Embodiment

A fifth exemplary embodiment is an exemplary embodiment in which correction values of a plurality of illumination profiles are obtained, for one pattern region 31. An imprint method of the present exemplary embodiment is almost similar to that of the flowchart illustrated in FIG. 6 and FIG. 7 of the first exemplary embodiment. A difference from the first exemplary embodiment will be described below.

Figure 13:
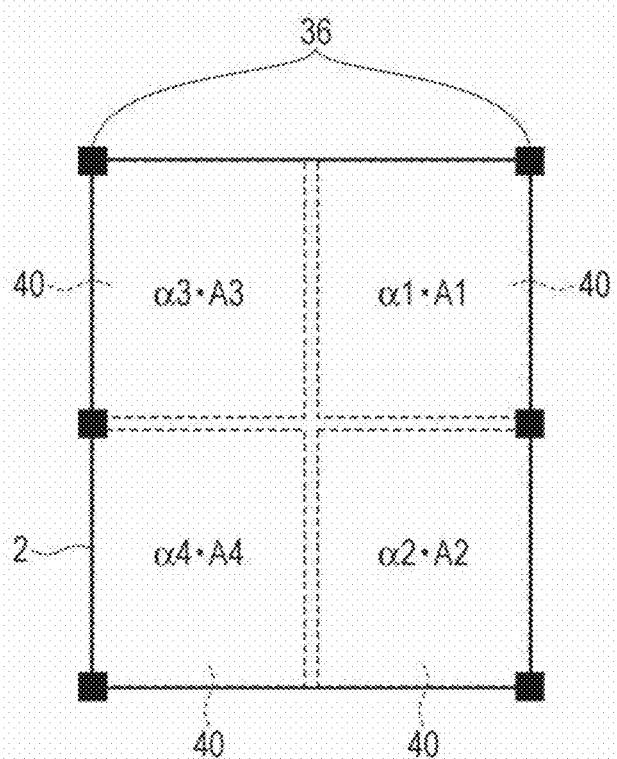
FIG. 13 is a diagram illustrating an imprint method of a fourth exemplary embodiment.

In the fifth exemplary embodiment, positions of six marks 36a illustrated in FIG. 13 are measured for one pattern region 31. In the present exemplary embodiment, the alignment system 24 has six detection scopes (detection units with the number corresponding to the number of marks associated with a shape of one pattern region) so as to allow simultaneous detection of all the marks 36a. Alternatively, the six marks 36a are detected dividedly plural times. Based on a result of the detection obtained in this manner, the deformation amounts not only for the magnification component but also a high order component of a bow shape or a barrel shape (high order distortion component) of the pattern region 31 are able to be obtained.

The control unit 25 obtains the thermal deformation amount of each of divided regions 40 illustrated in FIG. 13, which is obtained by virtually dividing the pattern region 31 into four regions, and causes the storage unit 26 to store the resultant. The control unit 25 obtains a standard illumination profile An and correction values $\alpha 1$ to $\alpha 4$ of the standard illumination profile An for each of the divided regions 40 and causes the storage unit 26 to store them.

The heat value to be applied may be increased for the divided region 40 whose deformation amount is smaller than a target deformation amount (difficult to be thermally deformed). For example, the illumination profile is corrected so that the illumination increases. The heat value to be applied may be decreased for the divided region 40 whose deformation amount is large (thermally deformed easily). For example, the illumination profile is corrected so that the illumination decreases. The illumination profile ($\alpha n \times An$) is defined for each of the divided regions 40 in this manner.

Thereby, it is possible to perform the thermal deformation by considering variation of thermal undeformability in each of the divided regions 40. Since the illumination profile is defined in consideration of the deformation amount for a high order component of a bow shape or a barrel shape (high order distortion component), it is possible to deform the substrate 2 with higher precision compared to the first exemplary embodiment when performing pattern formation. This makes it possible to reduce an overlay error in each of the pattern regions 31 and improve overlay precision.

Note that, the second exemplary embodiment may be applied to the method for selecting the pattern region 31 subjected to the thermal deformation measurement, and the third exemplary embodiment or the fourth exemplary embodiment may be applied to a timing for performing the thermal deformation measurement. The number of the divided regions 40 is only required to be two or more per one pattern region 31. Each two divided regions 40 (part of divided regions 40) of the pattern regions 31 having an equal thermal deformation amount (adjacent pattern regions 31) may be combined to obtain the correction value $\alpha n$ corresponding to one pattern region 31.

Sixth Exemplary Embodiment

A configuration of the imprint apparatus 1 according to a sixth exemplary embodiment is the same as that of the first exemplary embodiment. In the present exemplary embodiment, before the step of forming the pattern on the substrate 2 for mass production, the pattern region 31 in a standard substrate is thermally deformed by using the heating mechanism 15 while the chuck 20 is sucking the standard substrate, and a correction value of the standard illumination profile 31 is obtained. The correction value obtained in this manner is applied to the substrate 2 for mass production, which is different from the standard substrate. The present exemplary embodiment is advantageous for a case where variation of deformability per unit heat value between the pattern regions 31 greatly depends on the shape of the chuck 20.

The standard substrate is a substrate made of the same material as the substrate 2 used for the operation of pattern formation and is a substrate in which the marks 36a are formed with a regular arrangement. That is, the standard substrate is a substrate in which the shape of the pattern region 31 is not distorted because of a process or the like. By performing the thermal deformation measurement with a use of the standard substrate, it is possible to define the illumination profile in consideration of thermal deformability due to a difference of a contact state of the chuck 20 and the substrate 2 and form the pattern on the substrate 2.

In the present exemplary embodiment, even in a case of substrates 2 in different lots, a common correction value of the illumination profile is applied to the pattern regions 31 having the same position facing the chuck 20. The thermal deformation measurement may be merely performed each time the chuck 20 is exchanged, thus making it possible to improve throughput compared to other exemplary embodiments.

Seventh Exemplary Embodiment

Figure 14A:
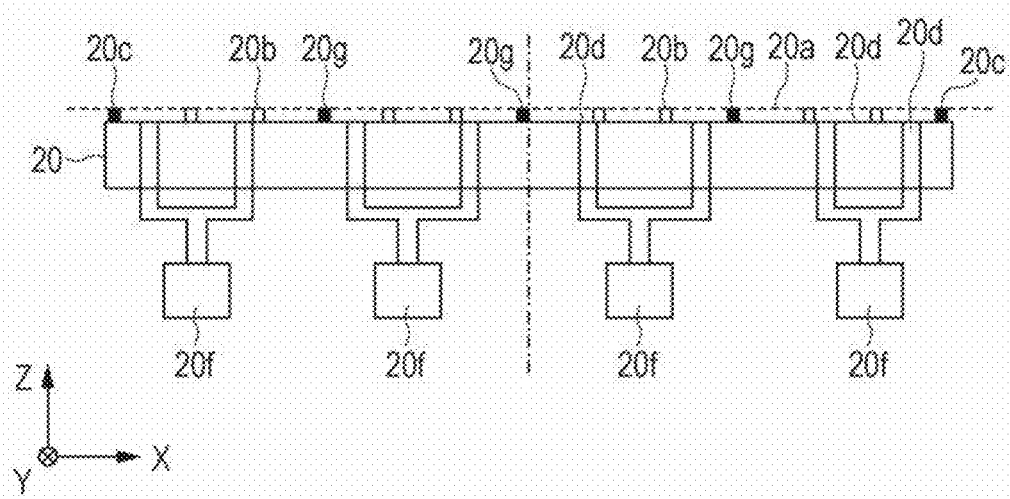
FIGS. 14A and 14B are diagrams for explaining divided regions of a chuck.
Figure 14B:
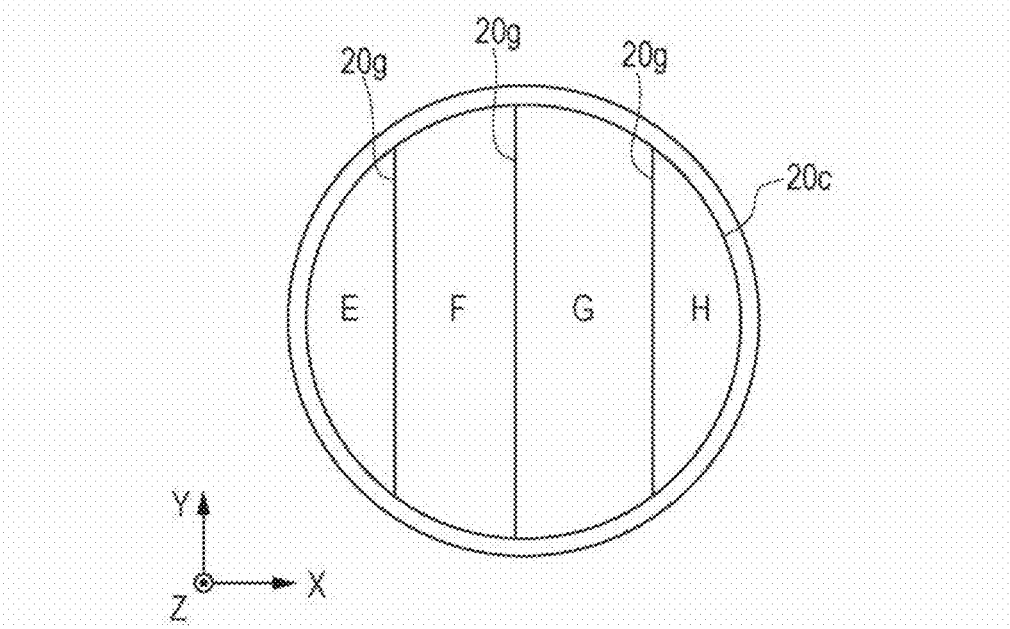

FIG. 14A illustrates a front view of the surroundings of the chuck 20 of an imprint apparatus 1 according to a seventh exemplary embodiment and FIG. 14B illustrates the surroundings of the chuck 20 thereof viewed from a +Z-direction. The imprint apparatus 1 has four vacuum pumps (a plurality of attracting units) 20f and each of the vacuum pumps 20f controls the suction pressure (attracting force) of the substrate 2 for each of divided regions E to H of the chuck 20. The chuck 20 has members 20g existing as boundaries of the divided regions E to H.

The control unit 25 obtains a plurality of correction amounts α corresponding to different positions in one divided region, which are sucked by the common vacuum pump 20f. For example, in the divided region F, the thermal deformation measurement is performed at least in two pattern regions 31, and the correction amounts α corresponding to each of the two pattern regions 31 are obtained.

When tendency of a frictional force of each of the divided regions is known, the vacuum pump 20f may control the suction force according to the frictional force. For example, When a region in which the frictional force is easy to increase is known in a predetermined divided region, the thermal deformation measurement and the operation of pattern formation may be performed with the suction pressure of the predetermined divided region lowered. It is possible to reduce the frictional force and reduce the correction amount α.

The frictional force between the substrate 2 and the chuck 20 varies according to the shape of the substrate 2 in the out-of-plane direction (Z-axis direction). When the shape in the out-of-plane direction is known before the thermal deformation measurement, the control unit 25 may generate the standard illumination profile according to the shape in the out-of-plane direction.

Eighth Exemplary Embodiment

Figure 15:
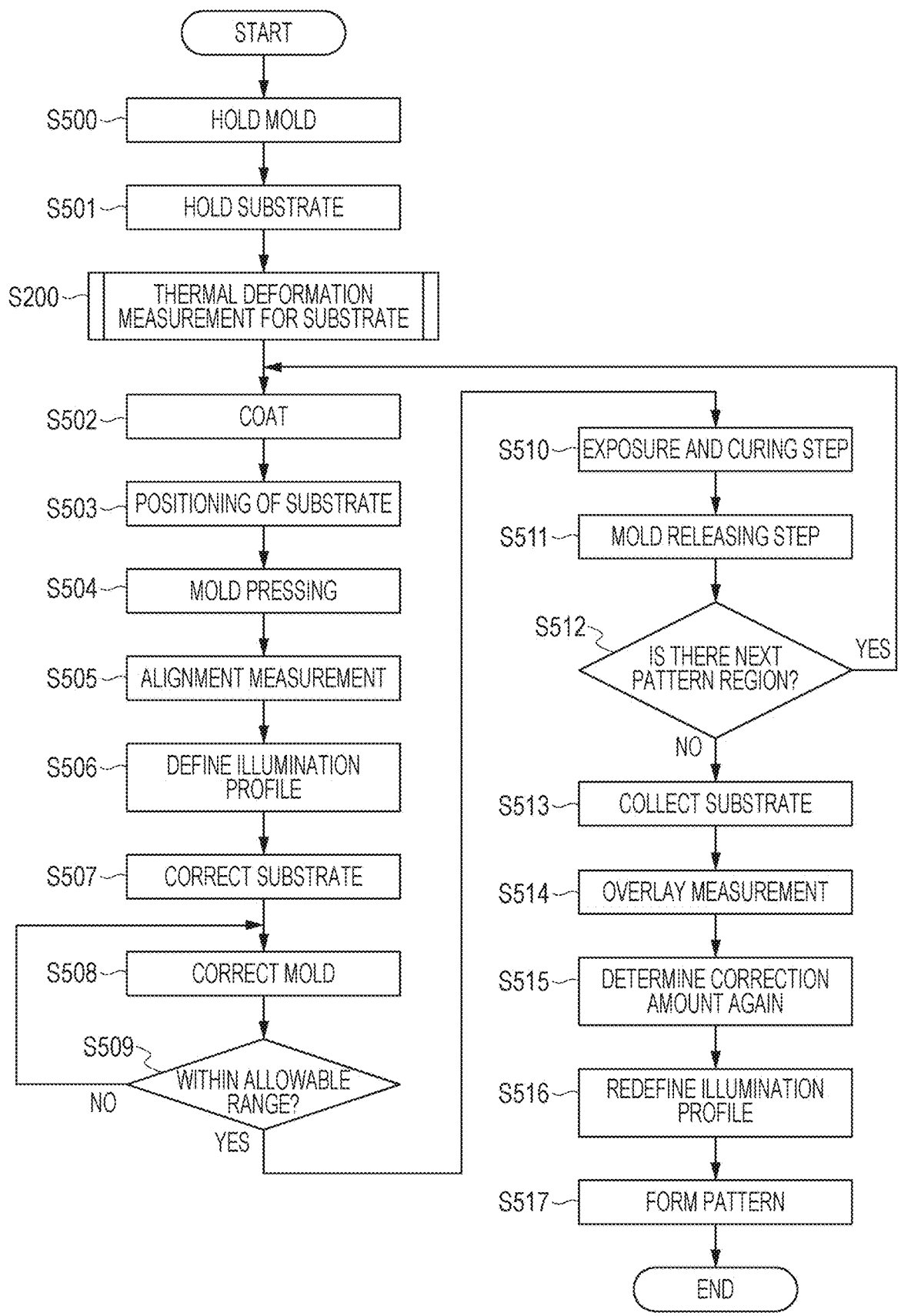
FIG. 15 is a flowchart illustrating an imprint method of an eighth exemplary embodiment.

FIG. 15 is a flowchart of an imprint method according to the present exemplary embodiment. Steps of S501 to S513 are similar to the steps of S100 to S113 in the flowchart illustrated in FIG. 6, so that description thereof will be omitted. At S514, the substrate collected from the imprint apparatus 1 is carried in an overlay inspection apparatus (hereinafter, referred to as an inspection apparatus) and the inspection apparatus calculates a position shift amount between the pattern region 31 and the pattern formed at S510.

The control unit 25 determines a correction amount for further correcting the illumination profile after correction based on the position shift amount obtained from the inspection apparatus (S515). Alternatively, the control unit 25 may generate the standard illumination profile again based on the position shift amount obtained from the inspection apparatus. Then, the control unit 25 redefines (regenerates) the illumination profile (S506). By using the illumination profile defined at S506, patterns are formed in the pattern regions at the same position, which have been subjected to the same process.

Figure 16C:
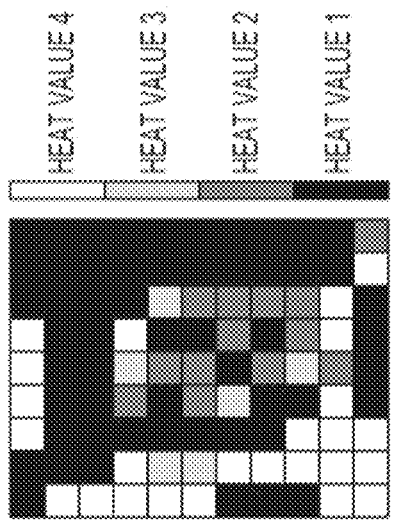
FIGS. 16A to 16F illustrate an example of an illumination profile.
Figure 16F:
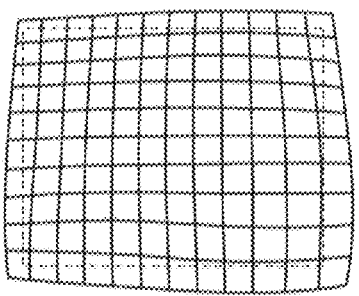
Figure 16B:
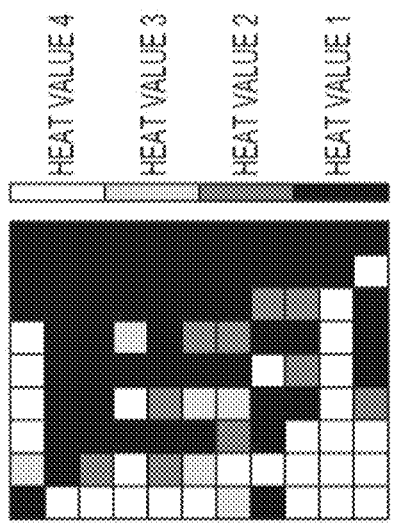
Figure 16E:
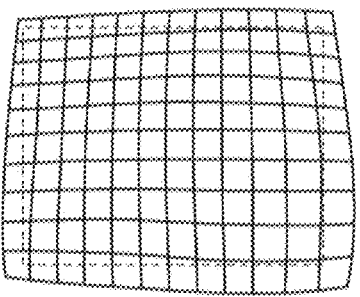
Figure 16A:
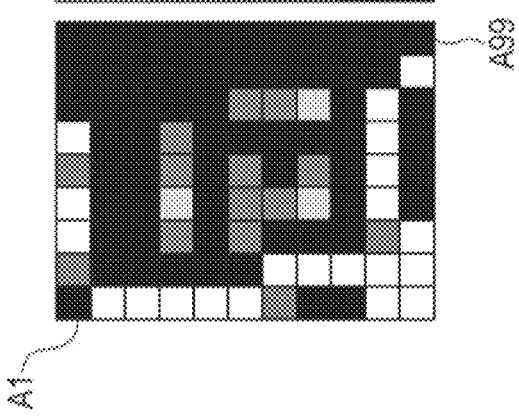

FIG. 16A illustrates heating distribution indicated by the standard illumination profile and FIG. 16B illustrates heating distribution indicated by the illumination profile obtained by correcting the standard illumination profile by the thermal deformation measurement. Further, FIG. 16C illustrates one example of heating distribution indicated by the illumination profile obtained by feedback of an inspection result by the inspection apparatus. Heat values applied to sections A1 to A99 are represented by a heat value 1 to a heat value 4.

Figure 16D:
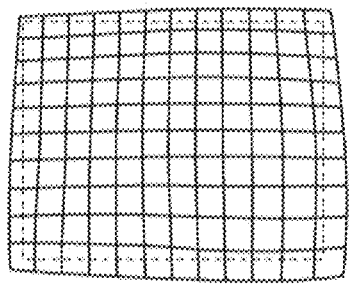

FIG. 16D illustrates the shape of the pattern region 31 when the pattern region 31 is deformed based on FIG. 16A, that is, when none of the exemplary embodiments is carried out. FIG. 16E illustrates the shape when the pattern region 31 is deformed based on FIG. 16B, that is, when any of the first to seventh exemplary embodiments is applied. FIG. 16F illustrates the shape when the pattern region 31 is deformed based on FIG. 16O, that is, when the eighth exemplary embodiment is applied.

Figure 17C:
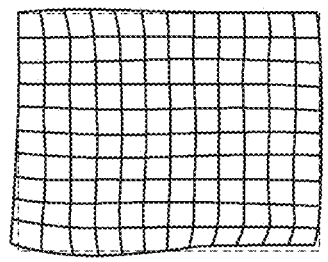
FIGS. 17A to 17C are diagrams for explaining effects of exemplary embodiments.
Figure 17B:
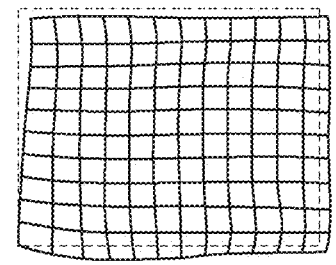
Figure 17A:
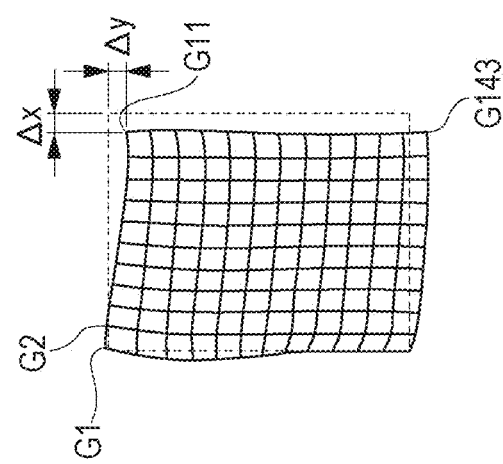

FIGS. 17A to 17C illustrate correction residuals when the pattern region 31 is deformed with the respective illumination profiles corresponding to the heating distribution of FIGS. 16A to 16C. For example, FIG. 17A indicates that a lattice point G1 hardly has correction residuals. FIG. 17A also indicates that deformation at a lattice point G11 in the +X-direction is lacking by Δx and deformation at a lattice point G11 in the Y-axis direction is lacking by Δy.

As illustrated in FIGS. 17A to 17C, FIG. 17B to which each of the exemplary embodiments is applied allows more reduction in the correction residual compared to FIG. 17A. Further, FIG. 17C to which the eighth exemplary embodiment is applied allows more reduction in the correction residual. Thus, it is possible to improve overlay precision between the pattern region 31 and the pattern portion 4a compared to the case to which each of the exemplary embodiments above is not applied.

Other Exemplary Embodiment

When the thermal deformation amount is measured after coating of the imprint material 3, by controlling an intensity of light emitted from a light source or controlling a time for illuminating heating light, a heat value applied to the pattern region 31 is controlled. Alternatively, a standard illumination profile and an illumination profile which are different from those obtained by measuring the thermal deformation amount before coating are generated. This is because measurement performed through the imprint material 3 (passing of the heating light through the imprint material 3) and an effect of a gap between the mold and the substrate 2 on the deformation amount of the pattern region are considered.

Thereby, it is possible to improve overlay precision more accurately. Note that, heat may be applied to the pattern region 31 by a method other than light illumination. For example, by using a plurality of heaters, the heat may be applied to the pattern region 31 while controlling on/off or a heating amount of each of the heaters.

The standard illumination profile serving as first information may be obtained based on a result of comparing the shape of the pattern region 31 to a known design value of the mold. The first information is not limited to the standard illumination profile indicating heating distribution. The first information may be positions of the marks 36a and 36b. Thus, based on position information of the marks 36a and 36b and second information at each position on the substrate 2, the control unit 25 may directly obtain the illumination profile needed at each of the positions without using the standard illumination profile.

A method for obtaining the second information is not limited to measurement of the marks 36a. The second information may be obtained, for example, from an amount of change in the shape, which is obtained by image recognition of the shape of the pattern region 31 for observation.

The standard illumination, profile may be common between the pattern regions 31 or may be different for each of the pattern regions 31. Though the description has been given by exemplifying a case where the pattern region 31 is one shot region. However, the pattern region 31 is not limited thereto and may have a size corresponding to a plurality of shot regions.

For the imprint material, a curable composition (also referred to as resin in an uncured state) which is cured when energy for curing is applied is used. As the energy for curing, electromagnetic wave, heat, and the like are used. The electromagnetic wave is light, such as infrared rays, visible light rays, and ultraviolet rays, whose wavelength is selected from a range of 10 nm or more to 1 mm or less.

The curable composition is a composition which is cured by illumination of light or heating. The photo-curable composition which is cured by light may contain at least a polymerizable compound and a photopolymerization initiator, and may contain a non-polymerizable compound or a solvent as necessary. The non-polymerizable compound is at least one selected from a group consisting of a sensitizer, a hydrogen donor, an internal mold release agent, surface activating agent, antioxidant, a polymer component, and the like.

The imprint material is applied in a film shape on the substrate by a spin coater or a slit coater. Alternatively, the imprint material may be applied, by a liquid jetting head, onto the substrate in a droplet shape or in an island shape or a film shape formed of a plurality of droplets connected with each other. A viscosity of the imprint material 3 (viscosity at 25° C.) is, for example, 1 mPa·s or more and 100 mPa·s or less. When a thermally curable imprint material is selected, however, the imprint material is to be material whose curing temperature is out of a temperature range of the substrate, which fluctuates due to heating for shape correction.

[Method for Producing Article]

A pattern of a cured composition formed by using the imprint apparatus is used permanently for at least a part of various articles or temporarily when producing various articles.

The article is an electric circuit element, an optical element, an MEMS (Micro Electro Mechanical Systems), a recording element, a sensor, a mold, or the like.

Examples of the electric circuit element include volatile or non-volatile semiconductor memories such as a DRAM (dynamic random access memory), a SRAM (Static Random Access Memory), a flash memory, and a MRAM (Magnetoresistive Random Access Memory), and semiconductor devices such as an LSI (large scale integration), a CCD (Charge Coupled Device), an image sensor, and an FPGA (field-programmable gate array).

An example of the mold includes a mold for imprint.

The pattern of the cured composition is directly used as at least a part of constituent members of the article or temporarily used as a resist mask. After etching, ion implantation or the like is performed at a step of processing the substrate, the resist mask is removed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-117798, filed on Jun. 10, 2015, and Japanese Patent Application No. 2016-020933, filed on Feb. 5, 2016 which are hereby incorporated by reference herein in their entirety.

What is claimed is:

1. An imprint apparatus which forms a pattern in shot region on a substrate by using a mold and an imprint material, comprising:
   a substrate holding unit which attracts and holds the substrate, attracting force of the substrate varies according to a position of the shot region on the substrate;
   a generation unit which generates heating distribution data indicating distribution of a heat value to be applied to the shot region;
   a heating unit which gives heat to the shot region to deform the shot region;
   an obtaining unit which obtains first information defined based on a difference of shapes of the shot region and a pattern portion of the mold, and second information about a deformation amount of the shot region, the second information is set based on a position of the shot region on the substrate, the second information being obtained by trying deformation of the shot region by the heating unit while the substrate holding unit is-attracting a position corresponding to the shot region of the substrate; and
   a patterning unit configured to form the pattern while the heating unit is deforming the shot region based on the heating distribution data generated by the generation unit, wherein
   the generation unit generates the heating distribution data based on the first information and the second information which are obtained by the obtaining unit.

2. The imprint apparatus according to claim 1, wherein the first information is temporal heating distribution data temporarily generated based on the difference of the shapes, and the generation unit generates the heating distribution data by correcting the first information with a use of the second information.

3. The imprint apparatus according to claim 2, wherein the heating distribution data is data obtained by multiplying the temporal heating distribution data by a correction coefficient obtained from the second information.

4. The imprint apparatus according to claim 1, comprising a detection unit which detects a plurality of marks provided in the shot region in the trying deformation, wherein the obtaining unit obtains the second information based on change in positions of the marks detected by the detection unit.

5. The imprint apparatus according to claim 1, comprising a plurality of attracting units each of which controls an attracting force of the substrate for each of a plurality of divided regions included in the substrate holding unit, and the obtaining unit obtains a plurality of pieces of second information corresponding to different positions in the divided regions attracted by the plurality of common attracting units.

6. The imprint apparatus according to claim 1, wherein there are a plurality of regions to be processed on the substrate, and the generation unit generates, based on the same second information, the heating distribution data associated with two regions to be processed among the plurality of regions to be processed.

7. The imprint apparatus according to claim 1, wherein there are a plurality of regions to be processed on the substrate, and two regions to be processed, which are subjected to trying deformation, are at positions having different distances from a center of the substrate.

8. The imprint apparatus according to claim 1, wherein there are a plurality of regions to be processed on the substrate, and the second information is information applied to each of the plurality of regions to be processed.

9. The imprint apparatus according to claim 1, wherein the second information is information applied to each of the divided regions which are obtained by virtually dividing one shot region into a plurality of regions.

10. The imprint apparatus according to claim 1, wherein the heating unit has a light source for emitting light, and controls illumination of the light to apply a heat value corresponding to the heating distribution data to the shot region.

11. The imprint apparatus according to claim 1 forming a pattern on a plurality of substrates, wherein the second information is information obtained when shot region on a first substrate in the same lot is thermally deformed, and the second information about the first substrate is applied to a substrate different from the first substrate.

12. The imprint apparatus according to claim 1, wherein the second information is information obtained by trying deformation of shot region on a standard substrate, and an operation of forming the pattern is performed for a substrate different from the standard substrate.

13. An imprint apparatus which forms a pattern in shot region on a substrate by using a mold and an imprint material, comprising:

a substrate holding unit which attracts and holds the substrate, attracting force of the substrate varies according to a position of the shot region on the substrate;

a plurality of attracting units each of which is able to control an attracting force of the substrate for each of a plurality of divided regions included in the substrate holding unit;

a generation unit which generates heating distribution data indicating distribution of a heat value to be applied to the region to be processed;

a heating unit which gives heat to the region to be processed to deform the shot region;

an obtaining unit which obtains first information defined based on a difference of shapes of the shot region and a pattern portion of the mold, and second information about a deformation amount of the shot region, the second information is set based on a position of the shot region on the substrate, the second information being obtained by trying deformation of the shot region by the heating unit while the substrate holding unit attracting a position corresponding to the shot region of the substrate; and a patterning unit configured to form the pattern while the heating unit is deforming the shot region based on the heating distribution data generated by the generation unit, wherein the obtaining unit obtains the second information corresponding to a plurality of different positions of the divided regions attracted by common attraction units, and the generation unit generates the heating distribution data corresponding to the plurality of different positions based on the first information and each of the second information which are obtained by the obtaining unit.

14. An imprint apparatus which forms a pattern in shot region on a substrate by using a mold and an imprint material, comprising:

a substrate holding unit which attracts and holds the substrate, attracting force of the substrate varies according to a position of the shot region on the substrate; and a heating unit which gives heat to the shot region to deform the shot region; wherein the heating unit deforms the shot region based on heating distribution data indicating distribution of a heat value to be applied to the shot region, that is generated based on first information defined based on a difference of shapes of the shot region and a pattern portion of the mold, and second information obtained by deforming the shot region with the heating unit while the substrate holding unit attracting a position corresponding to the shot region of the substrate, and the second information at a first shot region on the substrate is different from the second information at a second shot region that is different from the first shot region on the substrate.

15. The imprint apparatus according to claim 14, wherein the first information is temporal heating distribution data temporarily generated based on the difference of the shapes, and the second information is a correction value of the temporal heating distribution data obtained from information regarding the position of the shot region on the substrate.

16. An imprint apparatus which forms a pattern in shot region on a substrate by using a mold and an imprint material, comprising:

a heating unit which gives heat to the shot region to deform the shot region; and a substrate holding unit in which attracting force of the substrate varies according to a position of the shot region on the substrate, wherein the heating unit deforms the shot region based on first information regarding a difference of shapes of the shot region and a pattern portion of the mold, and second information regarding the position of the shot region on the substrate, and wherein the second information is set based on a position of the shot region on the substrate.

17. The imprint apparatus according to claim 16, wherein the heating unit gives heat to the shot region based on the heating distribution data obtained from the information regarding the difference of shapes of the shot region and a pattern portion of the mold and the correction value of the heating distribution data obtained from the second information.

\* \* \* \* \*